US011901519B2

(12) United States Patent
Moon

(10) Patent No.: US 11,901,519 B2
(45) Date of Patent: *Feb. 13, 2024

(54) ENERGY STORAGE SYSTEMS WITH MULTIPLE MATRIX ENERGY FLOW CONTROL AND PROGRAMMABLE CHARGING AND DISCHARGING OPTIONS

(71) Applicant: Sung Ub Moon, Richmond (CA)

(72) Inventor: Sung Ub Moon, Richmond (CA)

(73) Assignee: Sung Ub Moon, Richmond (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/075,807

(22) Filed: Dec. 6, 2022

(65) Prior Publication Data

US 2023/0095987 A1 Mar. 30, 2023

Related U.S. Application Data

(63) Continuation of application No. 16/239,369, filed on Jan. 3, 2019, now Pat. No. 11,532,840.
(Continued)

(51) Int. Cl.
*H02J 7/00* (2006.01)
*H01M 10/42* (2006.01)
(Continued)

(52) U.S. Cl.
CPC ...... *H01M 10/425* (2013.01); *G01R 31/3646* (2019.01); *H01M 10/441* (2013.01);
(Continued)

(58) Field of Classification Search
USPC ....................................................... 320/103
See application file for complete search history.

(56) References Cited

U.S. PATENT DOCUMENTS 7,772,799 B2 8/2010 Wu
9,041,345 B2 5/2015 Choi
(Continued)

FOREIGN PATENT DOCUMENTS

CN 102263420 A 11/2011
DE 102013212692 A1 12/2014
(Continued)

OTHER PUBLICATIONS

DC2DC ePower charger brochure, Enerdrive Pty Ltd, retrieved from http://www.enerdrive.com.au/wp-content/uploads/2017/04/DC2DC-Charger-2p-A4-2017-WEB-.pdf.

*Primary Examiner* — Samuel Berhanu
(74) *Attorney, Agent, or Firm* — Norton Rose Fulbright Canada LLP; Maya Medeiros

(57) ABSTRACT

The present disclosure provides an energy storage system comprising a plurality of input ports connectable to receive electrical power from one or more energy sources, a plurality of output ports connectable to deliver electrical power to one or more loads, a plurality of battery modules, a switching matrix connected between the plurality of battery modules and the plurality of inputs, and between the plurality of battery modules and the plurality of outputs, the switching matrix configured to selectively connect each battery module to any number of the plurality of input ports or any number of the plurality of output ports, each input port to any number of battery modules, and each output port to any number of battery modules, and a main battery management controller operably coupled to the switching matrix for controlling connections between each battery module and any number of the plurality of input ports or any number of the plurality of output ports.

20 Claims, 38 Drawing Sheets

Related U.S. Application Data

(60) Provisional application No. 62/613,362, filed on Jan. 3, 2018.

(51) Int. Cl.
*G01R 31/36* (2020.01)
*H01M 10/44* (2006.01)
*H01M 16/00* (2006.01)
*H01M 10/48* (2006.01)
*H02J 1/14* (2006.01)
*H01M 50/20* (2021.01)
*H01M 50/209* (2021.01)

(52) U.S. Cl.
CPC ......... *H01M 10/488* (2013.01); *H01M 16/00* (2013.01); *H01M 50/20* (2021.01); *H02J 1/14* (2013.01); *H02J 7/0019* (2013.01); *H01M 50/209* (2021.01); *H01M 2010/4271* (2013.01); *H01M 2010/4278* (2013.01); *H02J 2300/28* (2020.01)

(56) References Cited

U.S. PATENT DOCUMENTS

| | | |
|---|---|---|
| 2006/0006838 A1 | 1/2006 | Clarke |
| 2006/0006841 A1 | 1/2006 | Lee |
| 2006/0244420 A1* | 11/2006 | Stanesti ............... H02J 7/0068 320/128 |
| 2007/0230227 A1 | 10/2007 | Palmer |
| 2008/0266913 A1 | 10/2008 | Brotto et al. |
| 2009/0295330 A1* | 12/2009 | Li ........................ H02J 7/0013 320/124 |
| 2012/0212067 A1 | 8/2012 | Lai |
| 2012/0249071 A1 | 10/2012 | Yang |
| 2014/0015451 A1 | 1/2014 | Funabashi |
| 2014/0132069 A1 | 5/2014 | Aharon |
| 2015/0171632 A1 | 6/2015 | Fry |
| 2016/0043555 A1 | 2/2016 | Howell |
| 2016/0099590 A1 | 4/2016 | Velderman et al. |
| 2016/0372952 A1 | 12/2016 | Chen |
| 2019/0131797 A1 | 5/2019 | Chen |

FOREIGN PATENT DOCUMENTS

| | | |
|---|---|---|
| KR | 10-1841440 B1 | 3/2018 |
| KR | 10-1867765 B1 | 5/2018 |
| WO | 2018/032091 A1 | 2/2018 |

* cited by examiner

ENERGY STORAGE SYSTEMS WITH MULTIPLE MATRIX ENERGY FLOW CONTROL AND PROGRAMMABLE CHARGING AND DISCHARGING OPTIONS

CROSS REFERENCE TO RELATED APPLICATION

This application is a continuation of U.S. patent application Ser. No. 16/239,369 filed Jan. 3, 2019 which claims the benefit of priority of U.S. Provisional Patent Application No. 62/613,362 filed Jan. 3, 2018, which is hereby incorporated herein by reference in its entirety.

TECHNICAL FIELD

The present disclosure relates to improvements in energy storage systems, which typically comprise a system of batteries. Certain embodiments provide optimized usage of stored energy or battery power.

BACKGROUND

The prevalence of and society's dependence on energy storage systems such as electric battery systems is ever-growing. Many companies have developed, and are developing energy storage systems with increased capacity, less cost, more efficiency and so on. Battery cells used with such systems can be made from a variety of materials such as nickel-cadmium (NiCd), nickel-zinc (NiZn), nickel metal hydride (NiMH), lithium-ion (Li-ion) and so on.

Examples of prior art energy storage systems include U.S. Pat. Nos. 7,772,799B2, 9,041,345B2, US20060006841A1, US20070230227A1, US20160099590A1, CN102263420A, DE102013212692A1, KR101841440B1, KR101867765B1 and WO2018032091A1.

The inventor has determined a need for improved energy storage systems.

SUMMARY

Embodiments of the present disclosure provide energy storage systems with improved speed and/or flexibility for charging and discharging of energy storage elements, which typically consists of a system of batteries or battery modules, to optimize the usage of stored energy or battery power. Certain embodiments of the present disclosure will also help to extend the life time of the energy storage system to which it is connected. One skilled in the art will note that systems according to some embodiments of the present disclosure provide several options for future expansion.

Some embodiments of the present disclosure provide an energy storage system, which is functional with broad range of battery sizes and capacities used by mainstream consumers, including smaller devices such as smart phones to larger devices such as electric vehicles and industrial energy storage systems. Other embodiments of the present disclosure include both smaller and larger capacity energy storage systems with a variety of battery sizes and capacities. These systems include those found in smart phones, personal computing devices, electric vehicles, uninterrupted power supplies (UPS), and other energy storage solutions (ESS) in which a battery is employed.

Certain embodiments provide for an increase charging rates beyond those offered by traditional energy storage systems, which have only one input connector for charging. Some embodiments of the present invention solve this problem by directing the charge to a multiple matrix energy flow control system, which allows for multiple charging inputs of a plurality of energy sources, including hydro and solar, simultaneously. Also, certain embodiments of the present disclosure are flexible and customizable with programmable functions, which allow the user to control how the energy is stored and saved, as well as how the saved energy is distributed to connected devices. This programming ability will also allow certain devices to be prioritized in charging order, as specified.

A system according to one embodiment is comprised of one main printed circuit board assembly connected to two or more battery modules, a plurality of input charging ports, a plurality of output ports, and a housing for the system.

Example energy storage systems described in the present disclosure are designed to increase the efficiency of an energy storage system comprised of a plurality of battery modules, each of which can be of a different size, capacity or type from the other battery modules. The energy storage system described herein is optimized with multiple input charging ports to increase charging rates and efficiency, as well as multiple discharging output ports, to improve the efficiency of battery usage and increase the overall life of the system of battery modules. The system is designed by employing a main battery management printed circuit board assembly (MBM PCBA) connected to each battery module inside the system. The MBM PCBA has a main programmable control chip (MPCC) and connectors to relay information to the input ports, output ports, battery modules, and status indicators. Each battery module is comprised of a slave battery management printed circuit board assembly (SBM PCBA) and battery cells, and its own set of multiple input ports and output ports.

In embodiments where status indicators are used, the status indicators can be LCD or LED and are configurable to display the status of the overall system itself, the status of each of the input and output ports, and the status of each or all of the individual battery modules within. The MPCC communicates with the SBM PCBA of each battery module to detect its status and display that status through the external display to show the condition of that battery module alongside the input power and output power of each of the ports. The MPCC of the MBM PCBA is programmable to set the priorities, maximum charge percentages, and desired sequences of charging of the battery modules in concert with the input ports. The MPCC also controls the priorities, output percentages, and sequences of discharging for each of the battery module with programing combining with the output ports.

Further, certain embodiments of the invention provide an outer housing designed to hold together all parts comprising the invention. In one embodiment, this outer housing allows for expandable slots to facilitate future battery module upgrades and replacements.

A key feature of systems according to certain embodiments of the present disclosure is multiple input charging ports and an MBM PCBA that can control all ports. Given this design, it is possible to charge the battery modules of the system from multiple inputs simultaneously. As an example, if two input charging ports are connected to a power supply, a particular battery module or the entire system can be charged twice as fast as it would were only one input port so connected, provided that current limits of the battery module(s) are not exceeded. Further, if three input charging ports were connected to a power supply, the effective charging rate would be triple that of the system if only one input charging port was so connected.

In some embodiments, the system comprises a plurality of power battery modules that can be managed and used independently. The result of this configuration is that in the event one battery module fails, the other battery modules can compensate for that failure and continue operation. An added benefit is that the MBM PCBA can then identify the failed battery module, allowing it to be quickly repaired or replaced by the user. This flexibility and ability to minimize the scope of repair or replacement to only those modules warranting attention has the effect of extending the entire energy storage system's usable life, thereby saving the overall maintenance costs to the user.

In some embodiments, the system is configured to allow one or more battery modules to charge one or more other battery modules. In such embodiments, electrical energy stored in one battery module may be efficiently transferred to another battery module, for example to recharge a discharged module in preparation for a particular type load being connected to an output port.

In some embodiments, the system comprises battery modules with a variety of different characteristics. For example, some embodiments comprise battery modules having different types, voltages, capacities, energy/power densities, charging/discharging characteristics, and/or physical geometries. The MBM PCBA can select one or more battery modules to charge or discharge based on the type(s) of input power present at one or more input ports, and/or the type(s) of load connected to one or more output ports, in order to optimize the efficiency of charging or discharging. The capability of systems according to certain embodiments of the present disclosure to accommodate a plurality of battery modules means that the MBM PCBA can be configured to deliver optimal efficiency to a system of battery modules by providing the proper input or output voltages and/or currents to one or more battery modules selected based on a comparison of the battery module characteristics to the characteristics of the inputs or outputs. By not requiring uniformity across the battery modules, energy storage systems according to certain embodiments can be flexibly expanded, permitting broader application across a variety of devices, including by improving and replacing existing battery modules.

In general, the usable life time of a given battery module is dependent on the cycle time to charge and discharge the battery. Systems according to certain embodiments of the present disclosure include an MBM PCBA which controls each and all of the battery modules' usages, and the system can also manage the cycle times of each of the battery modules, further extending their respective life times. By way of illustration, if an example system included three battery modules, the MBM PCBA could be configured to allow one of the modules to stay charged but dormant unless and until there is an emergency need for it, as programmatically defined. The flexibility of systems according to certain embodiments permits the easy integration and configuration of user preferences and priorities.

Further, as the MBM PCBA can be configured to manage a plurality of battery modules of various capacities, voltages, and currents, the MBM PCBA could also control and optimize the discharging functions of any or all of the connected battery modules. Each of the discharging output ports could be configured by the user via the MBM PCBA to a specific output capacity, and those capacities need not be uniform across the battery modules. Further, the user could also specify the priorities, percentages, and sequences of the output ports as desired or as necessary for a specified output purpose or goal.

In some embodiments, a system according to the present disclosure communicates with connected external computing systems using any of USB, WiFi, Ethernet, or other connections. These external computing systems can host and run application software to configure the energy storage system's charging and discharging capacities and rates to preferable or other specified levels.

In some embodiments, each battery module could be managed independently using a plurality of types of the input and output ports, including USB, AC connectors, adaptor connectors, or EV chargers, all configured with proper optimization via the MBM PCBA. The MBM PCBA could then link the proper output port to proper input port without a physical modification of the ports, reducing the need for ongoing maintenance. This flexibility is implemented through the matrix of connections between input and output ports and the ability of the user to programmatically configure the system's functioning through the MBM PCBA. One purpose of this functionality is to optimize the input and output specification according to the devices connected to the output ports of the energy storage system.

Certain embodiments of the present invention may provide one or more of the following advantages:

Faster Charge of Battery Module with Multiple Input Ports and Priority Program;

Flexible setting up the Battery Module Charging (Input) Priority depend on the requirement of Battery Module Status;

Easy and Flexible to Expand to higher capacity System without technology limitation of Capacity and Materials;

Flexible setting up the Battery Module Discharging (Output) priority depend on the requirement of the connected devices;

Longer Life of the system using Independent Battery Module and flexible Management of Input and Output;

Easy to repair/replace of Each Battery Module as MBM (Main Battery Management PCBA) manage the Each Battery Module separately;

Easy to adapt new Green Energy Power, Solar, Wind power as it has Multiple Input Options and flexible Battery Module Specification.

Systems according to some embodiments of the present disclosure could be configured with different number of battery modules, input and output ports, and could be programmable by programmable chip, it could utilize the maximum battery/energy storage without special development new battery cell technologies, it could benefit all industries using battery energy storage systems.

One aspect of the present disclosure provides an energy storage system comprising a plurality of input ports connectable to receive electrical power from one or more energy sources, a plurality of output ports connectable to deliver electrical power to one or more loads, a plurality of battery modules, a switching matrix connected between the plurality of battery modules and the plurality of inputs, and between the plurality of battery modules and the plurality of outputs, the switching matrix configured to selectively connect each battery module to any number of the plurality of input ports or any number of the plurality of output ports, each input port to any number of battery modules, and each output port to any number of battery modules, and a main battery management controller operably coupled to the switching matrix for controlling connections between each battery module and any number of the plurality of input ports or any number of the plurality of output ports.

Further aspects and details of example embodiments are set forth below.

DRAWINGS

The following figures set forth embodiments in which like reference numerals denote like parts. Embodiments are illustrated by way of example and not by way of limitation in the accompanying figures.

Figure 1:
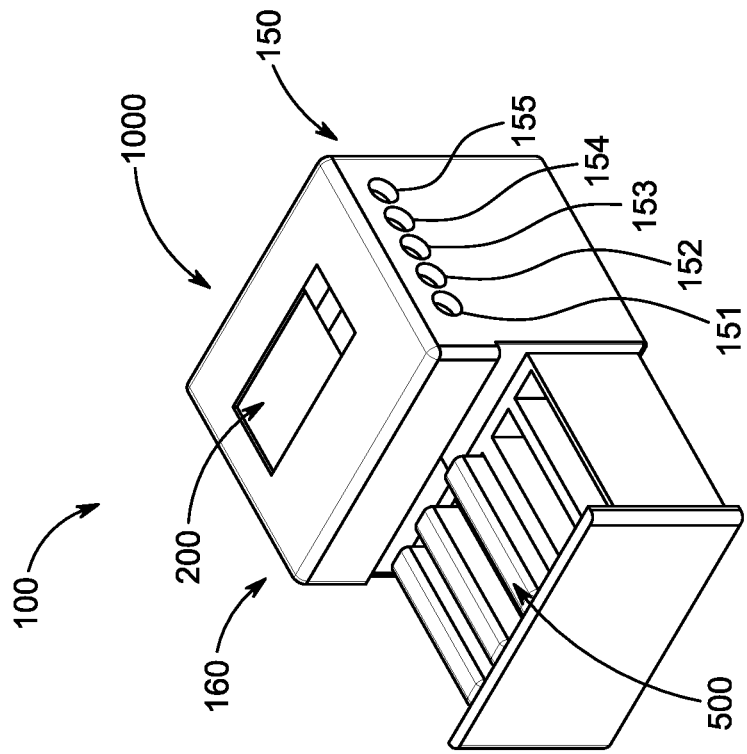
FIG. 1 is an illustration of an example system according to an embodiment of the present invention.
Figure 1:
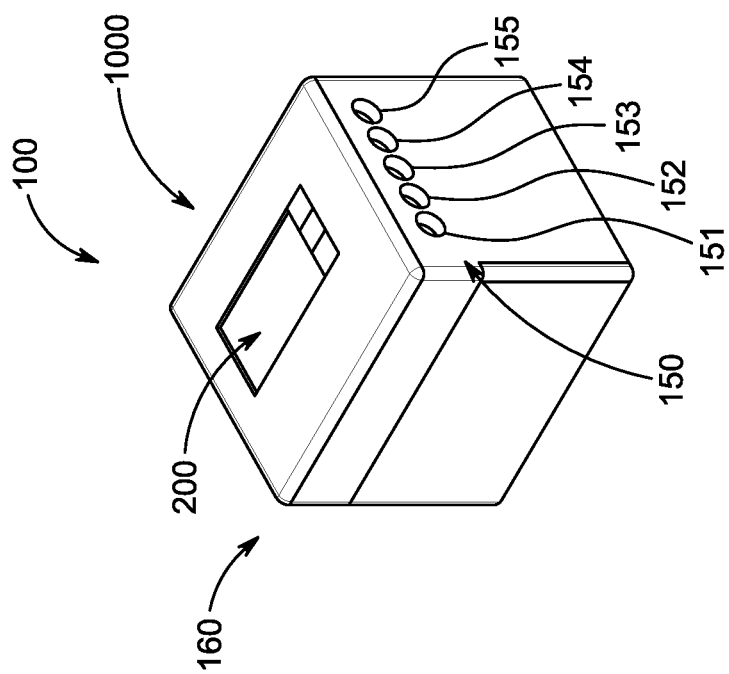

FIGS. 4, 5, 6, and 7 illustrate example status indicators of the system of FIG. 1.

Figure 8:
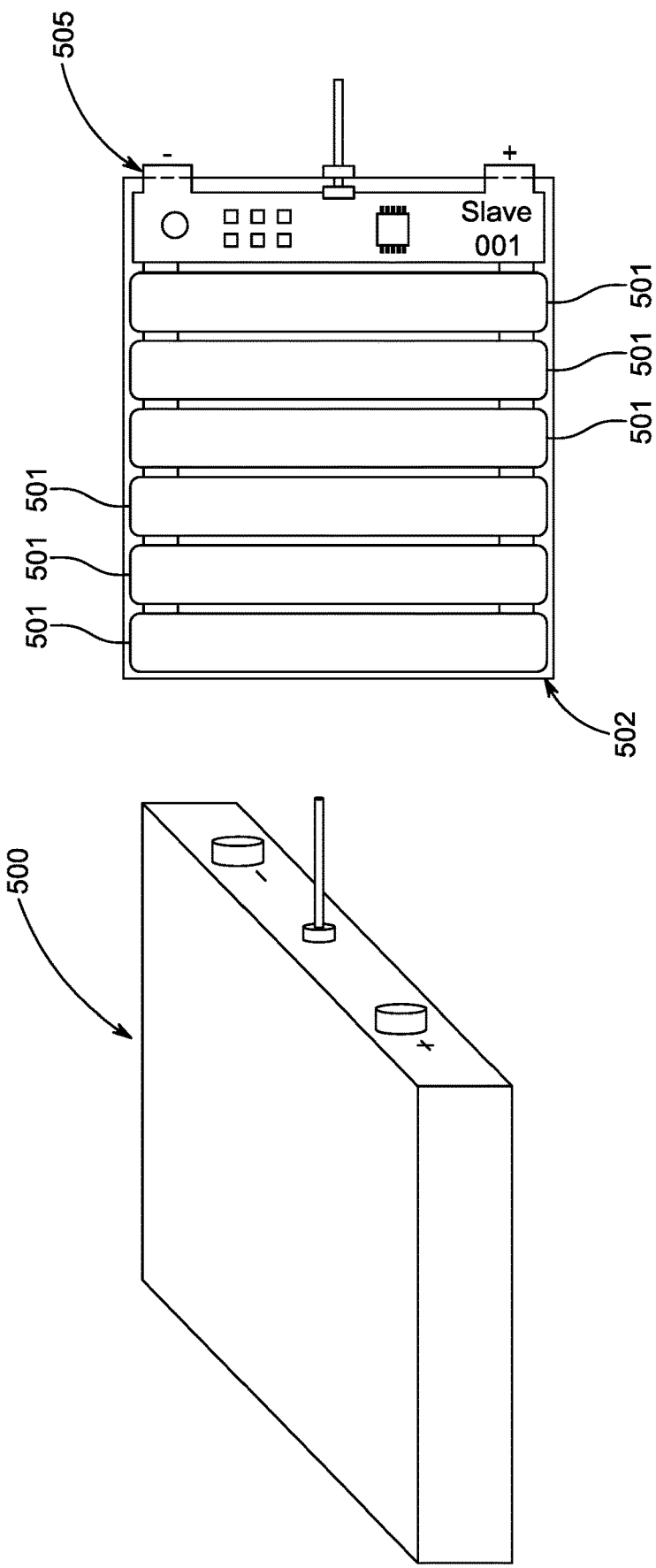

FIG. 8 is an illustration of an example battery module with a slave battery management system.

Figure 9:
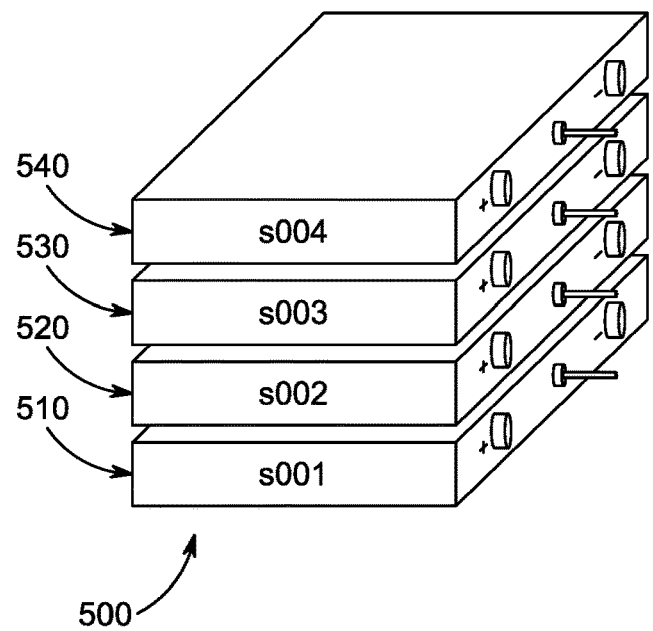

FIG. 9 is an illustration of an example embodiment wherein a plurality of battery modules are connected.

Figure 10:
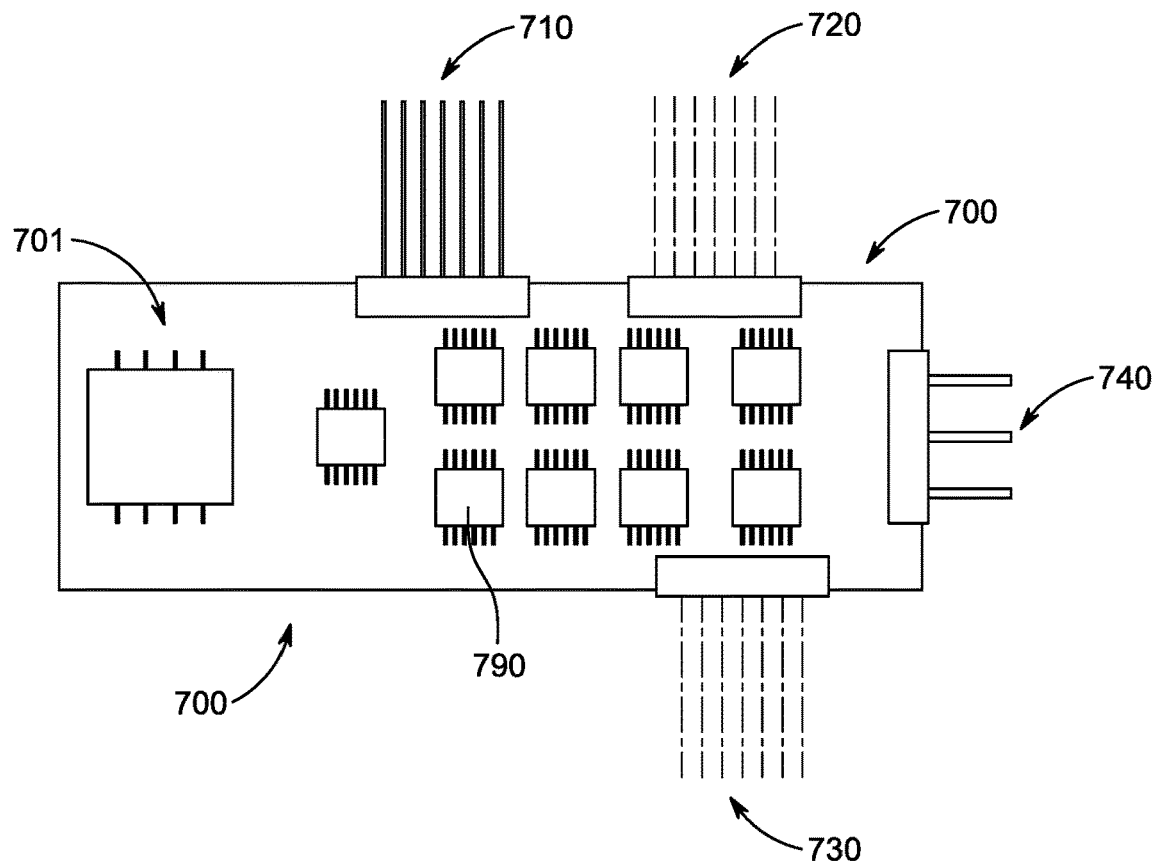
Figures 1, 10:
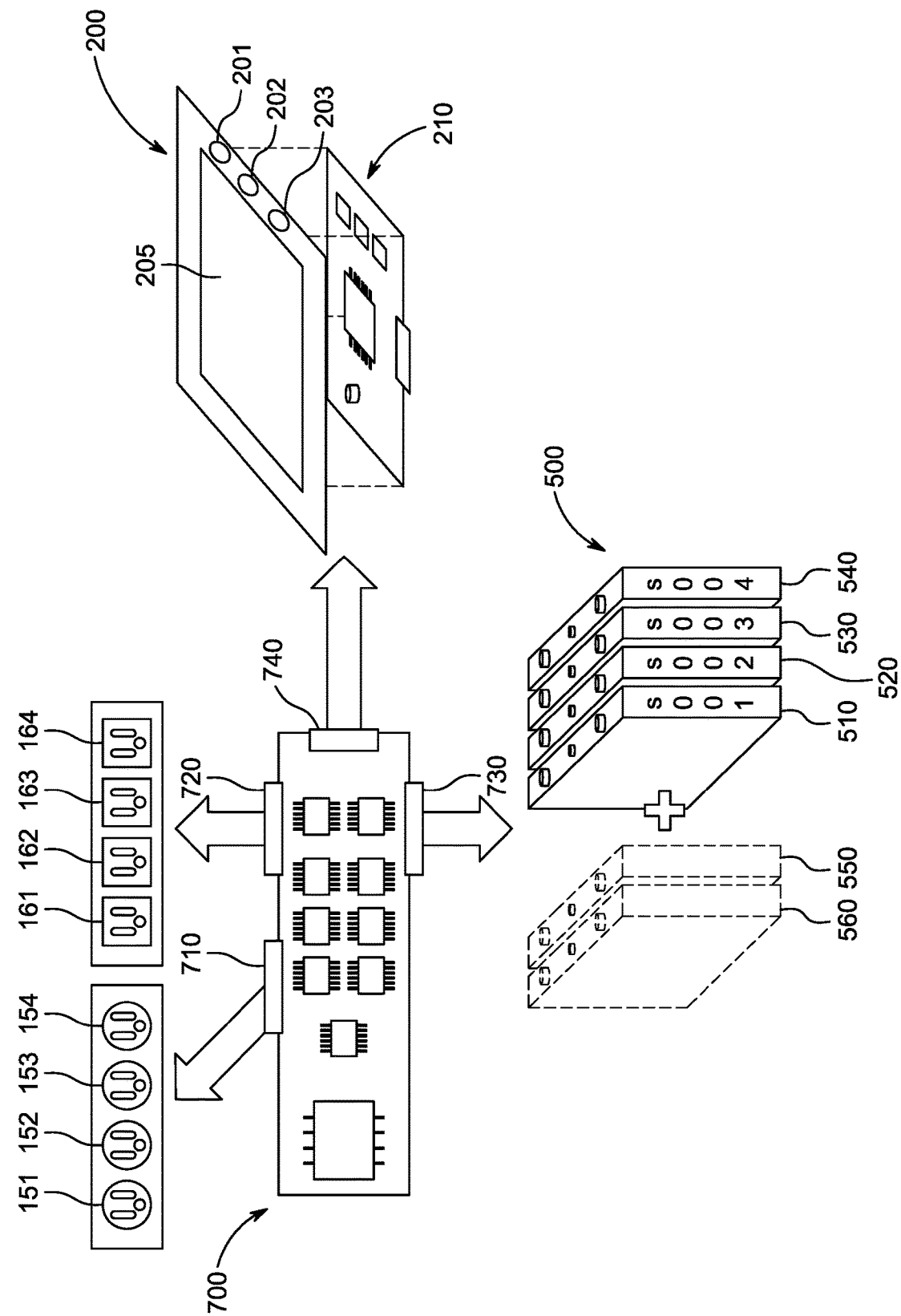

FIG. 10 is an illustration of an example of the main battery management printed circuit board assembly.

FIG. 10-1 is an illustration of the main battery management printed circuit board assembly managing the input ports, the output ports, a battery module, and a status indicator according to an example embodiment.

Figure 11:
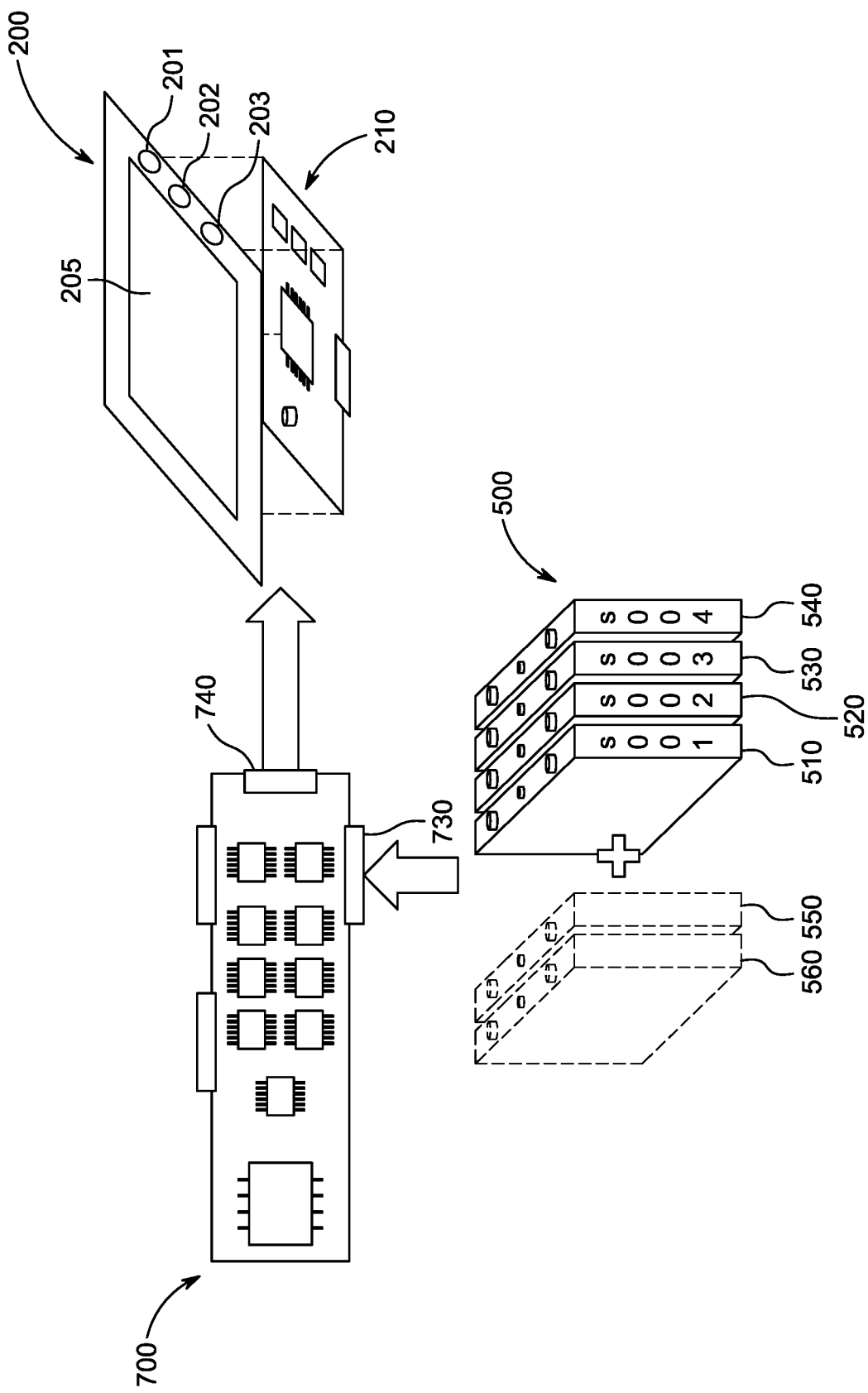

FIG. 11 is an illustration of an example flow of information throughout the system as it traverses the battery, battery module, main battery management printed circuit board assembly, and the status indicator.

Figure 12:
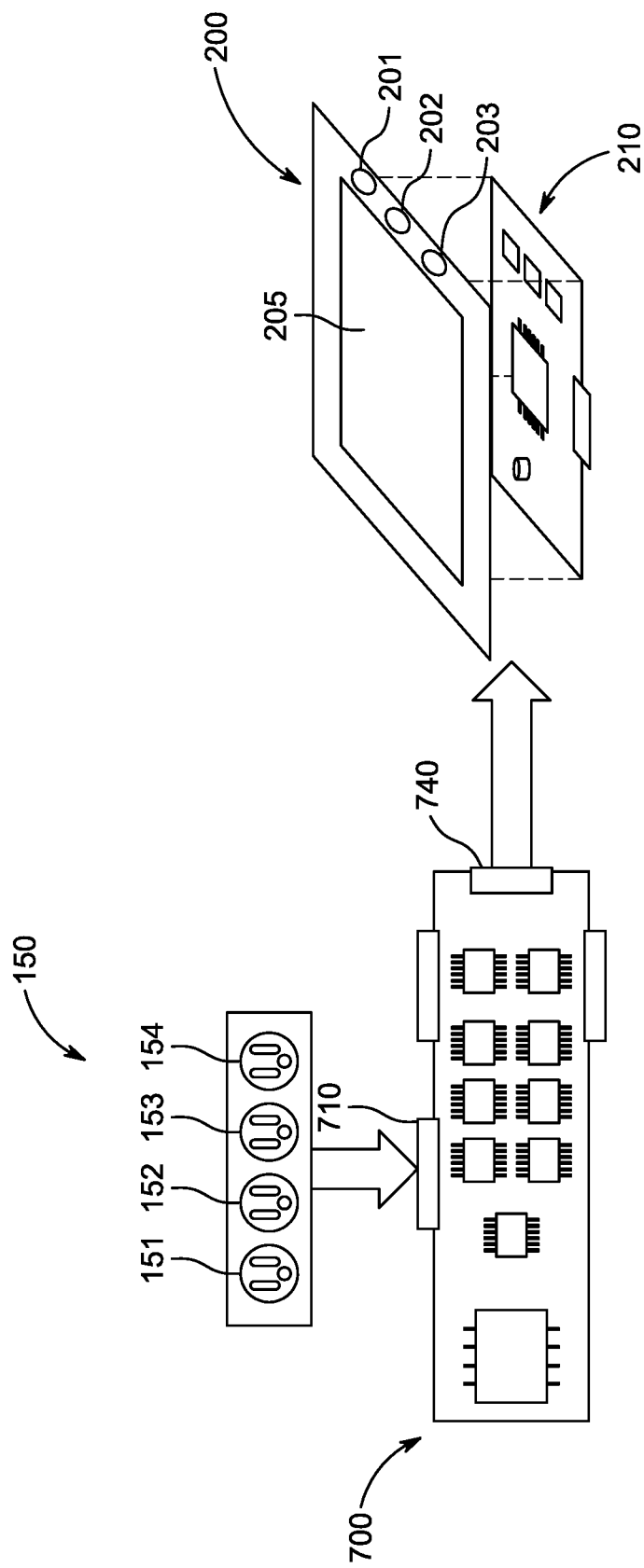

FIG. 12 is an illustration of an example flow of information throughout the system as it traverses the input ports, main battery management printed circuit board assembly, and the status indicator.

Figure 13:
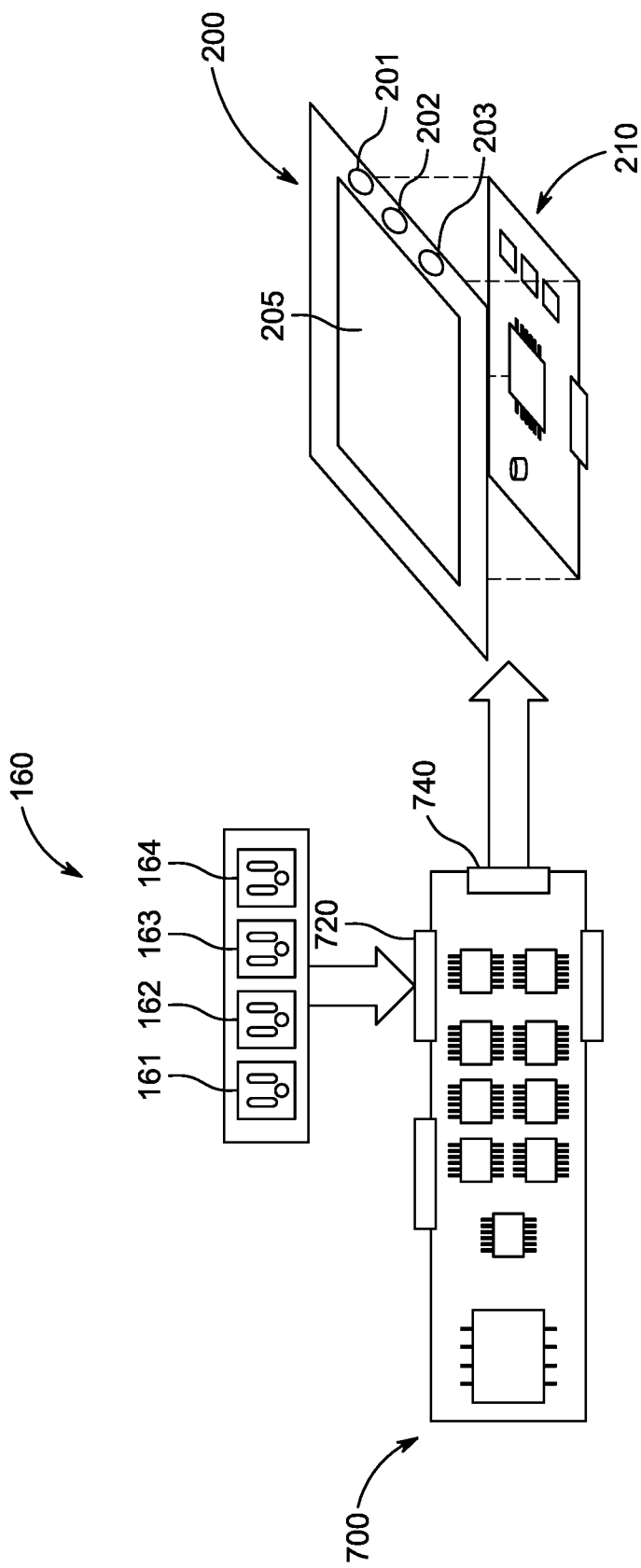

FIG. 13 is an illustration of an example flow of information throughout the system as it traverses the output ports, main battery management printed circuit board assembly, and the status indicator.

Figure 14:
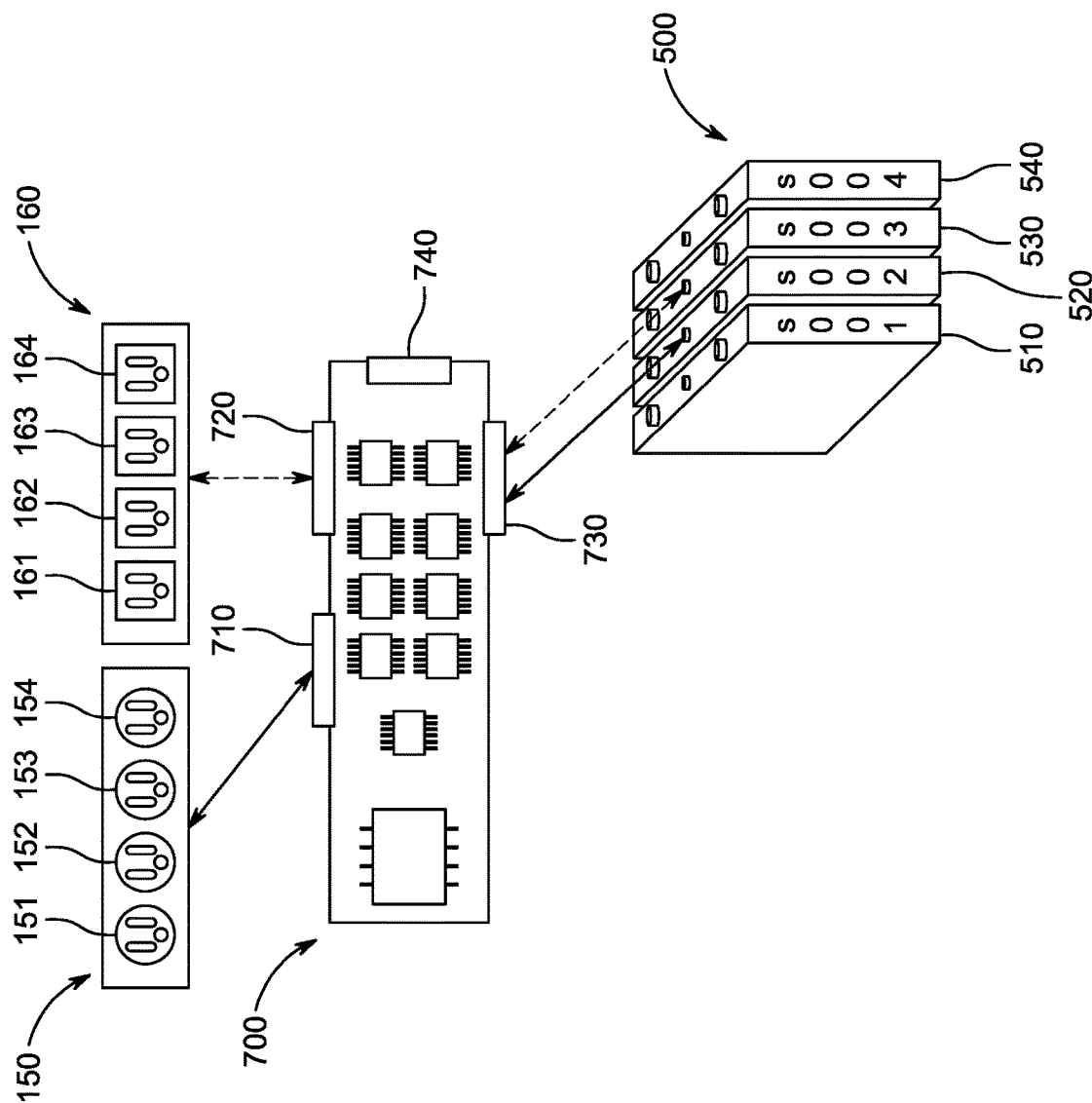

FIG. 14 is an illustration of an example flow of information throughout the system as it traverses the input ports, output ports, and battery though a main battery management printed circuit board assembly.

Figure 15:
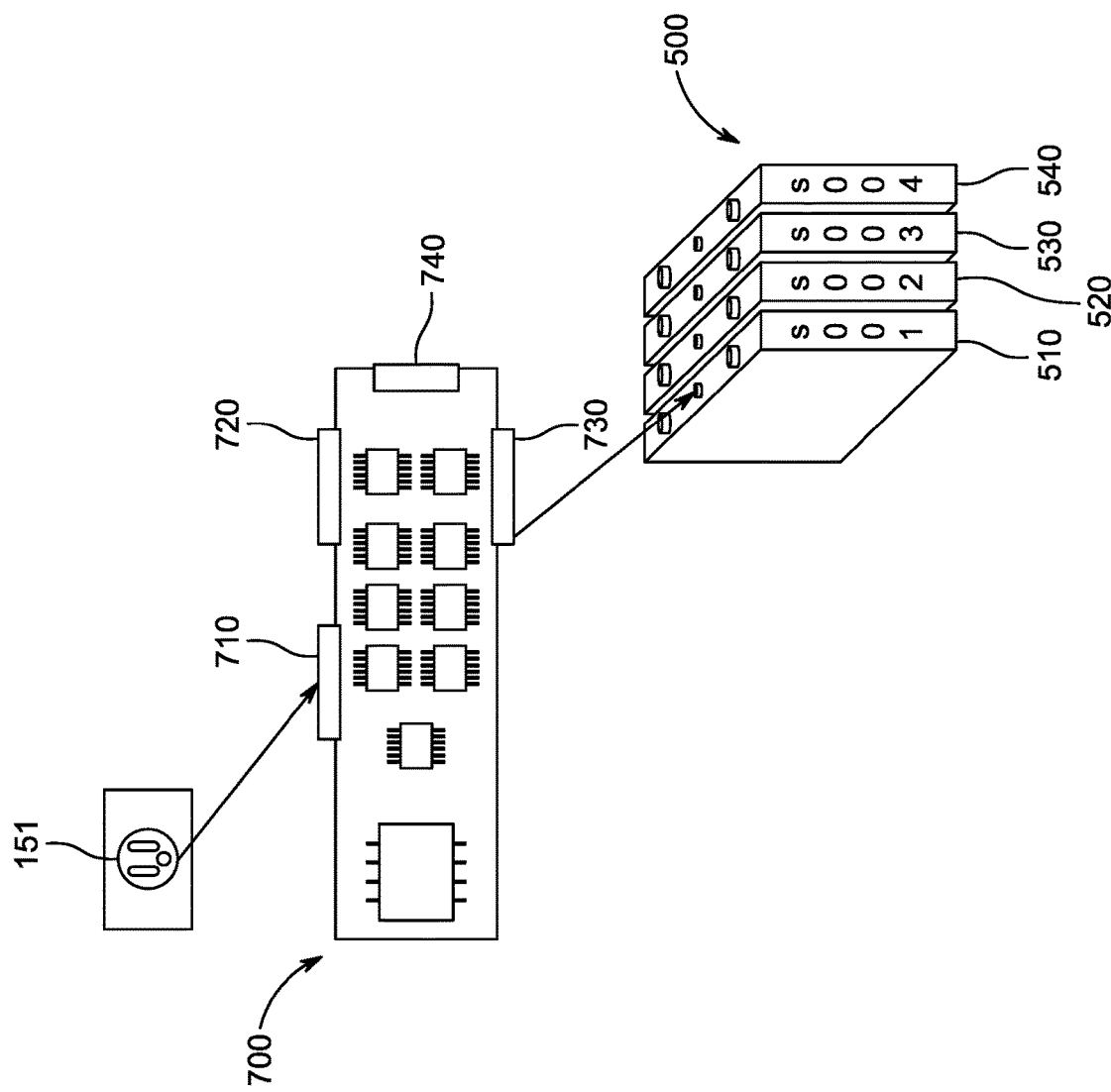

FIG. 15 is an illustration of an example flow of power from one input port through one battery module and a main battery management printed circuit board assembly.

Figure 16:
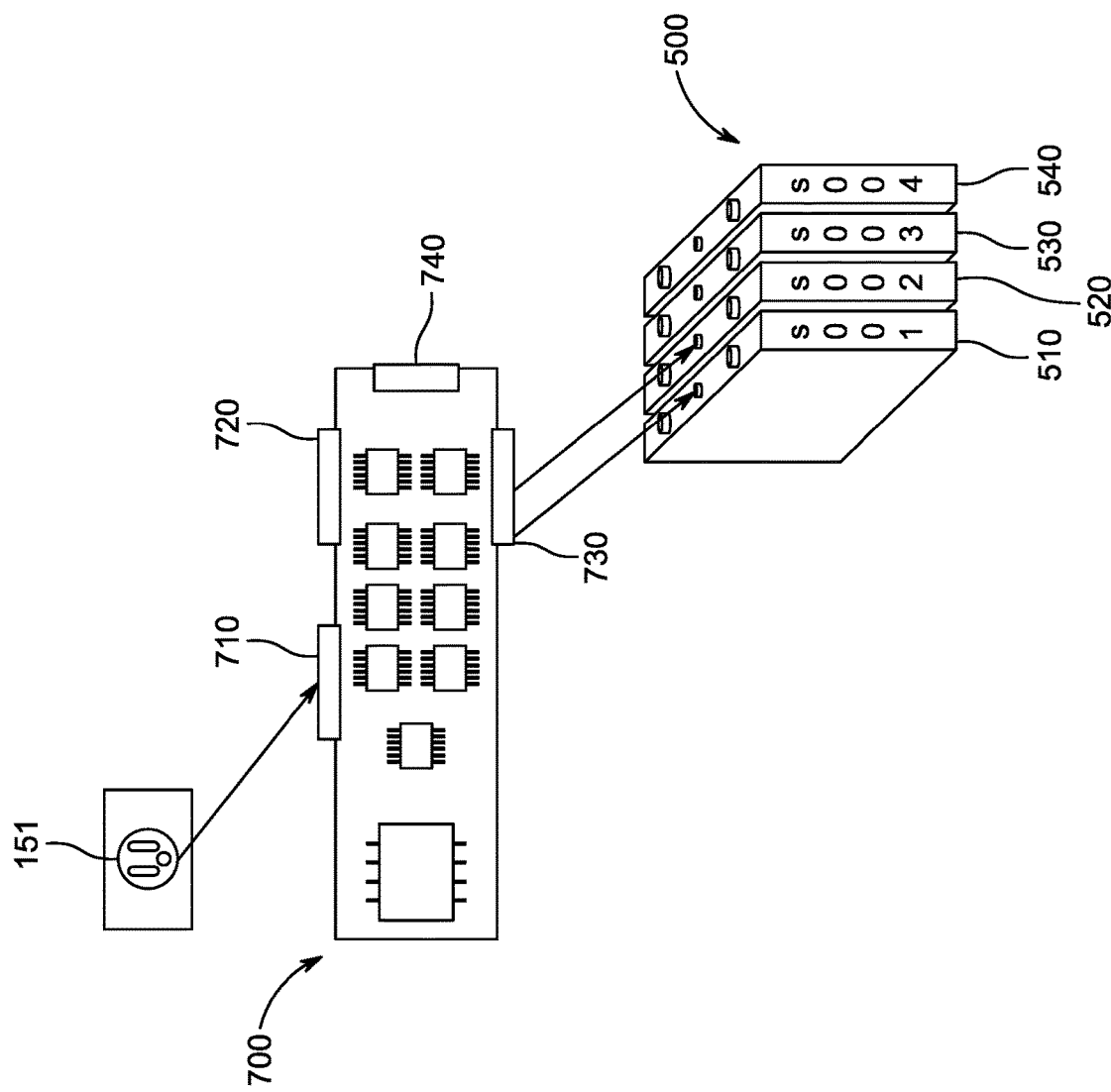

FIG. 16 is an illustration of an example flow of power from one input port through two battery modules and a main battery management printed circuit board assembly.

Figure 17:
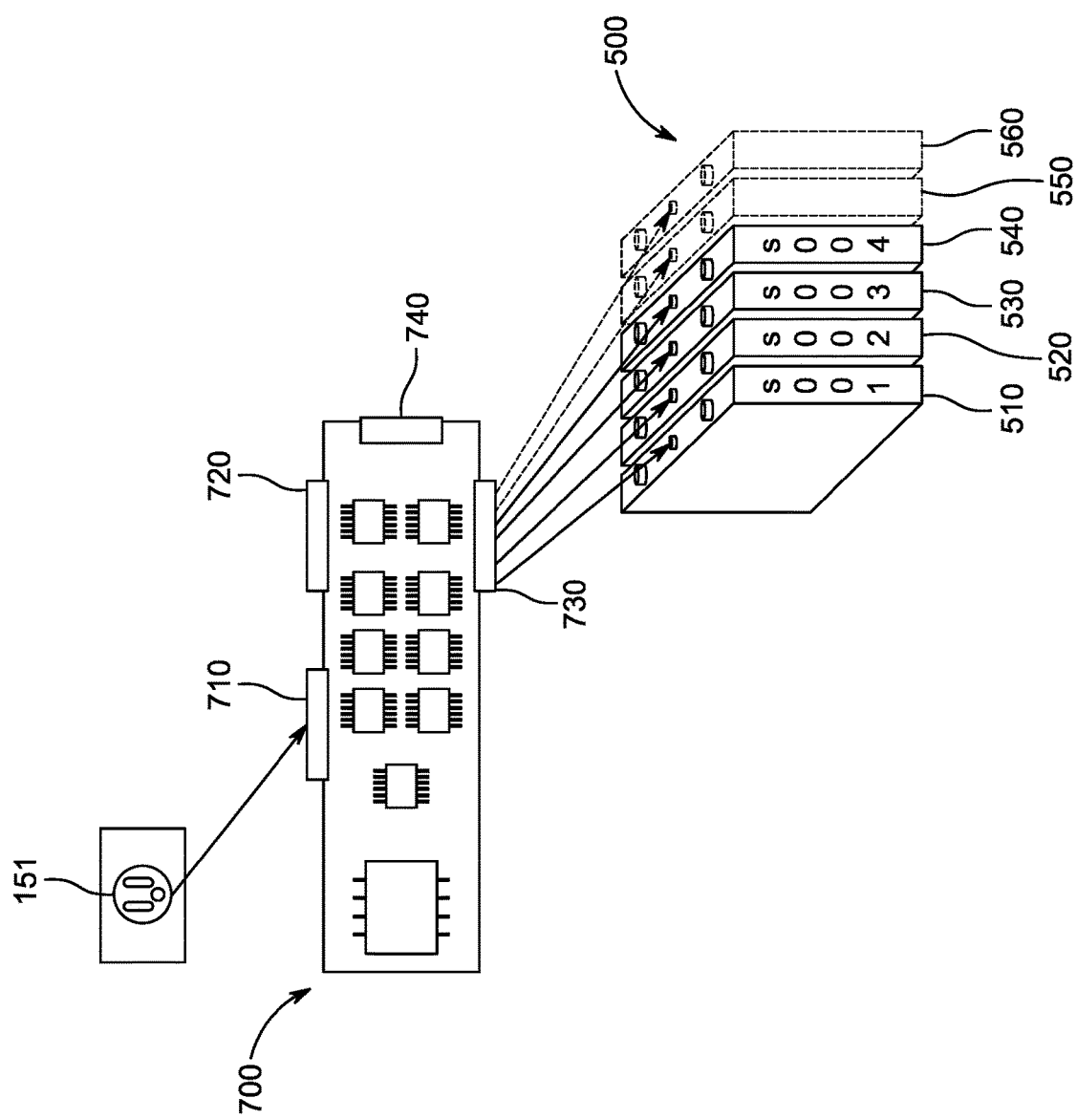

FIG. 17 is an illustration of an example flow of power from one input port through a plurality of battery modules and a main battery management printed circuit board assembly.

Figure 18:
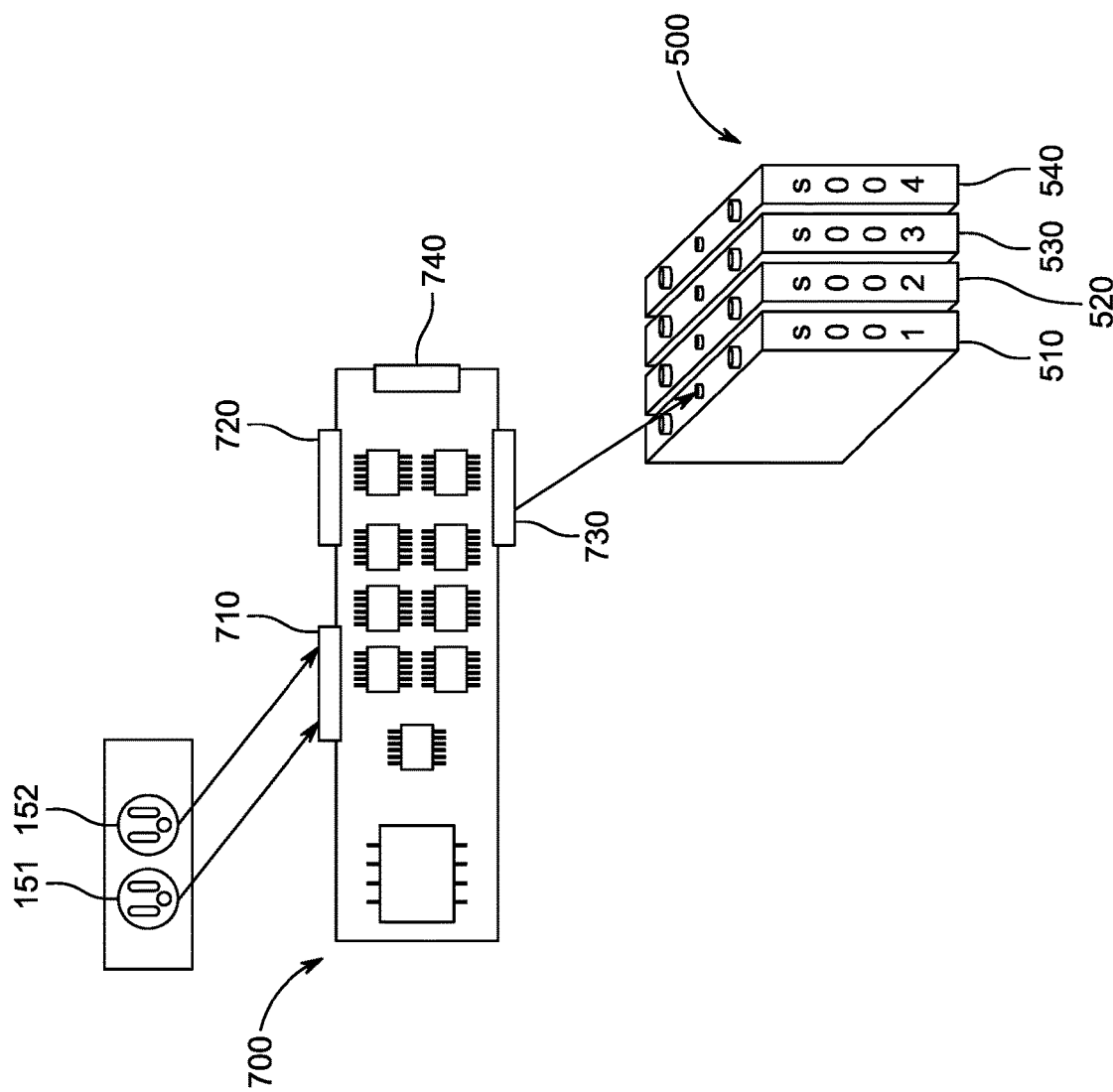

FIG. 18 is an illustration of an example flow of power from two input ports through a battery module and a main battery management printed circuit board assembly.

Figure 19:
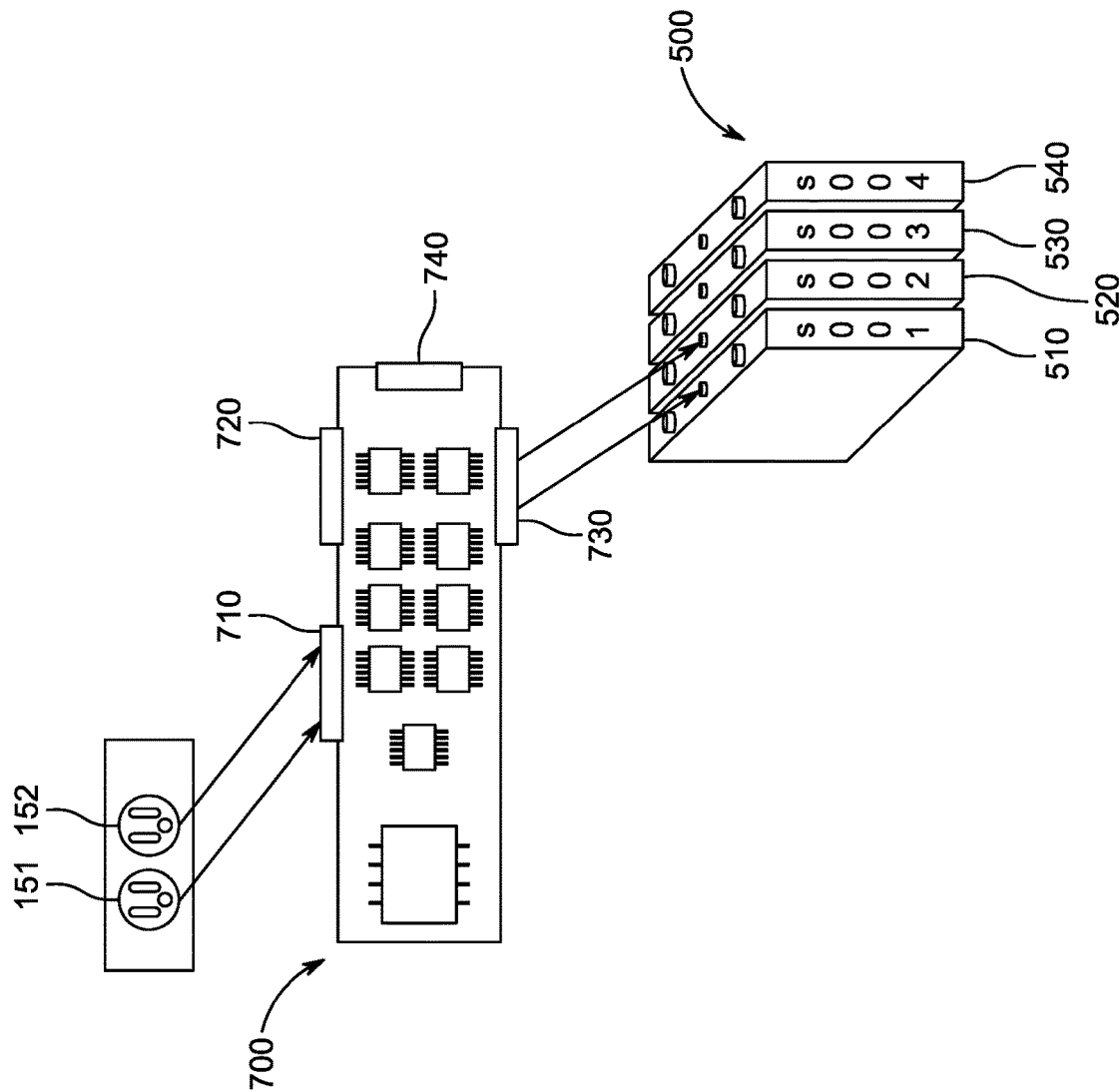

FIG. 19 is an illustration of an example flow of power from two input ports through two battery modules and a main battery management printed circuit board assembly.

Figure 20:
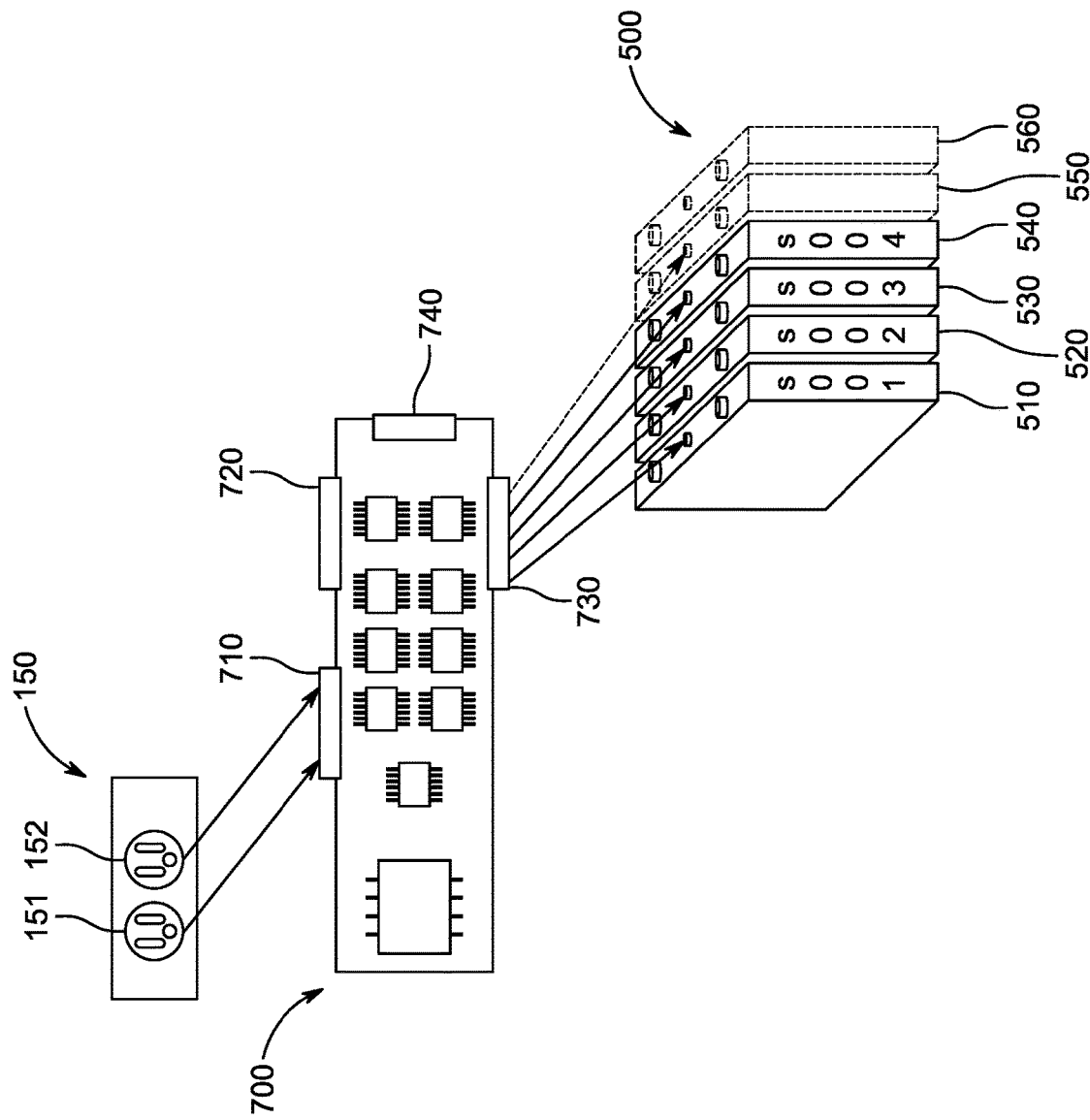

FIG. 20 is an illustration of an example flow of power from two input ports through a plurality of battery modules and a main battery management printed circuit board assembly.

Figure 21:
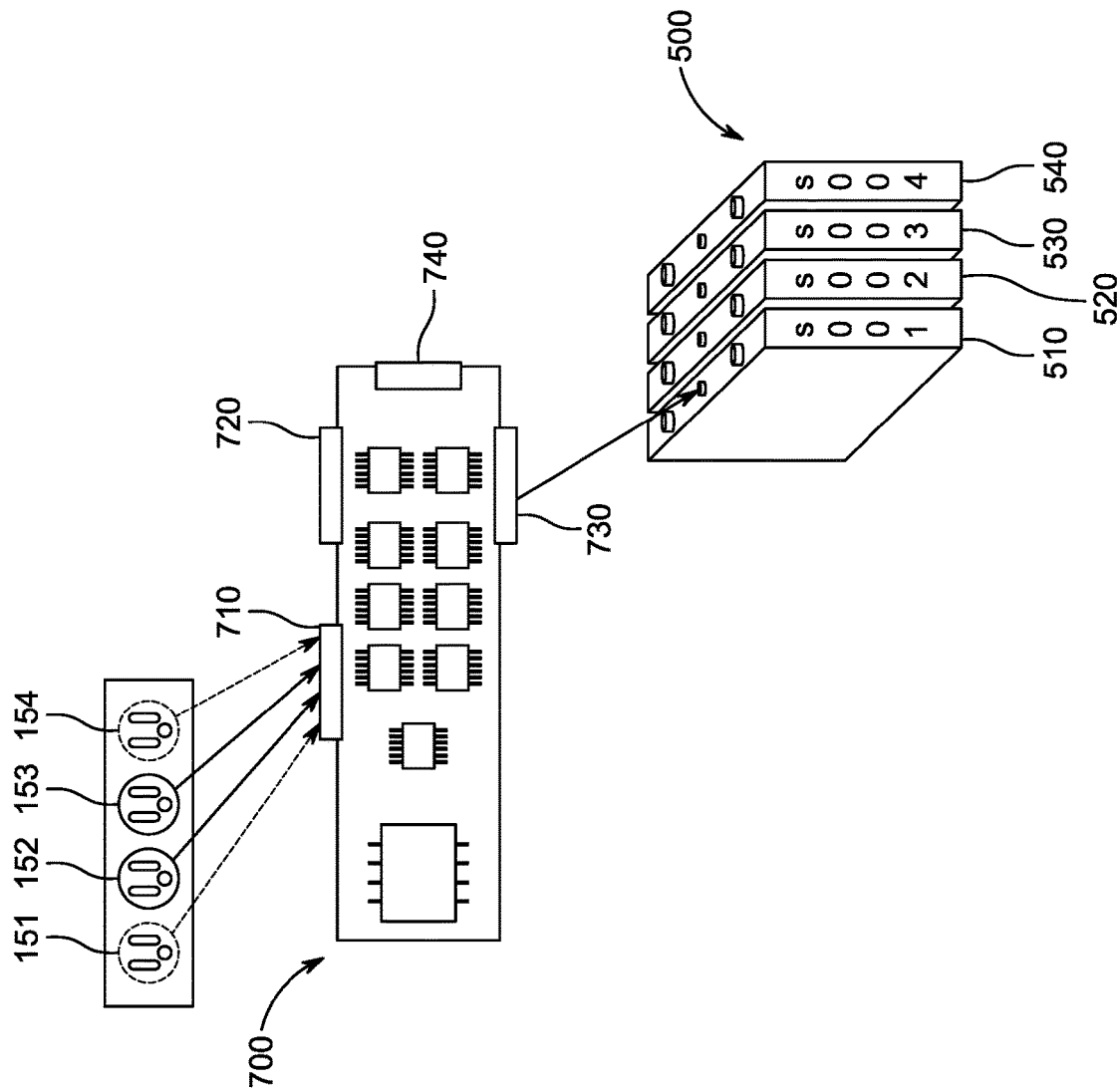

FIG. 21 is an illustration of an example flow of power from a plurality of input ports through a battery module and a main battery management printed circuit board assembly.

Figure 22:
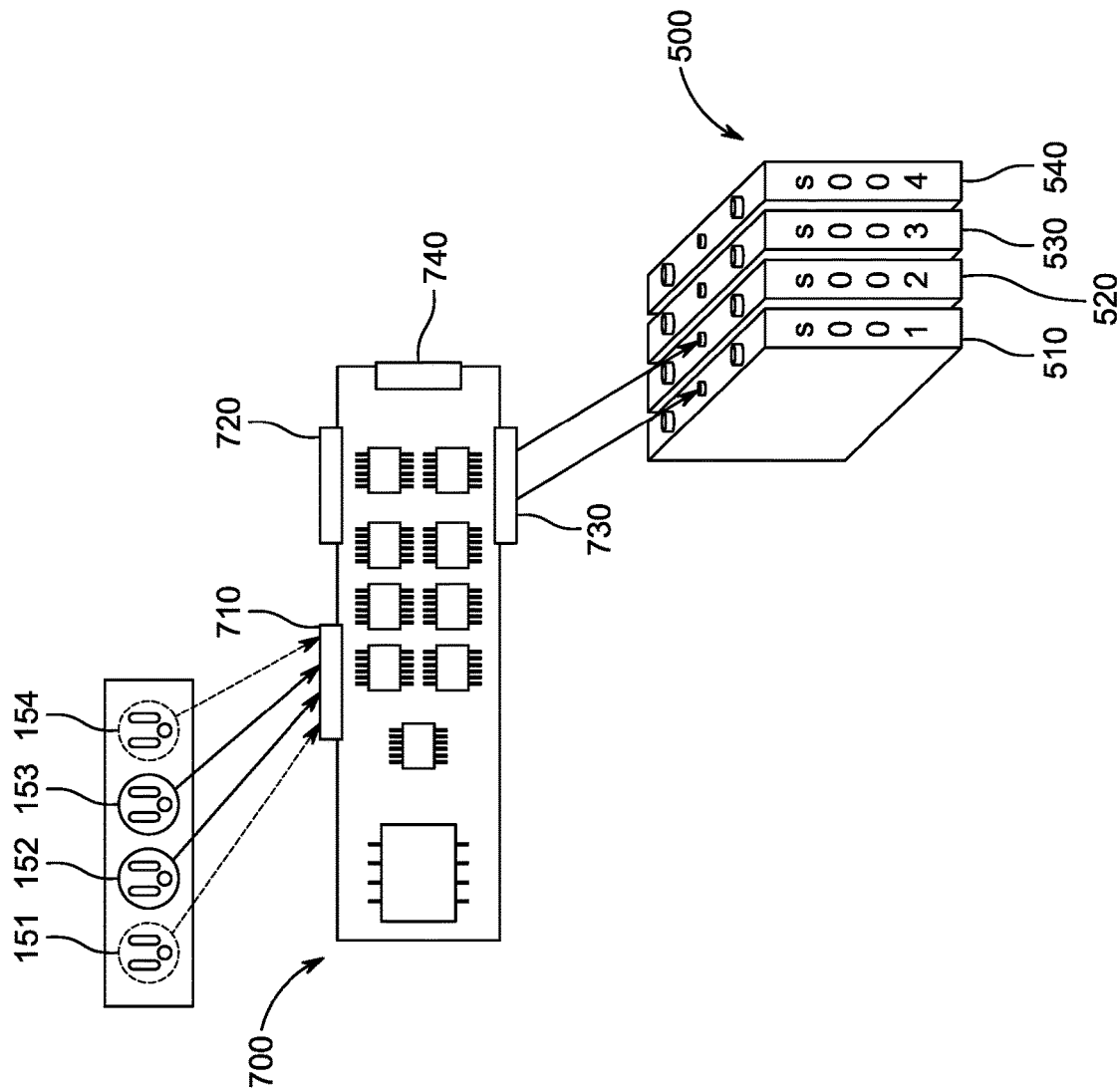

FIG. 22 is an illustration of an example flow of power from a plurality of input ports through two battery modules and a main battery management printed circuit board assembly.

Figure 23:
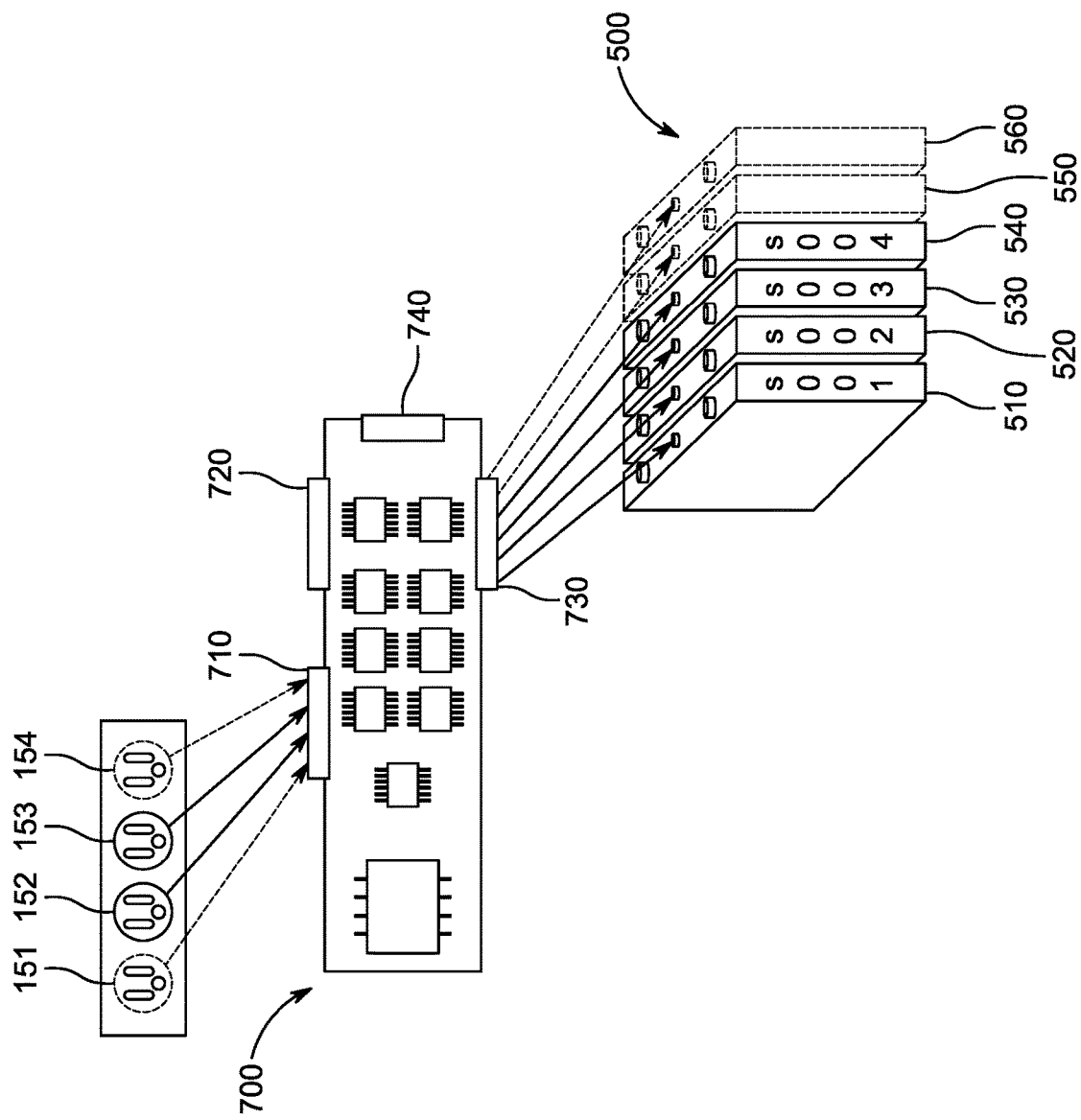

FIG. 23 is an illustration of an example flow of power from a plurality of input ports through a plurality of battery modules and a main battery management printed circuit board assembly.

Figure 24:
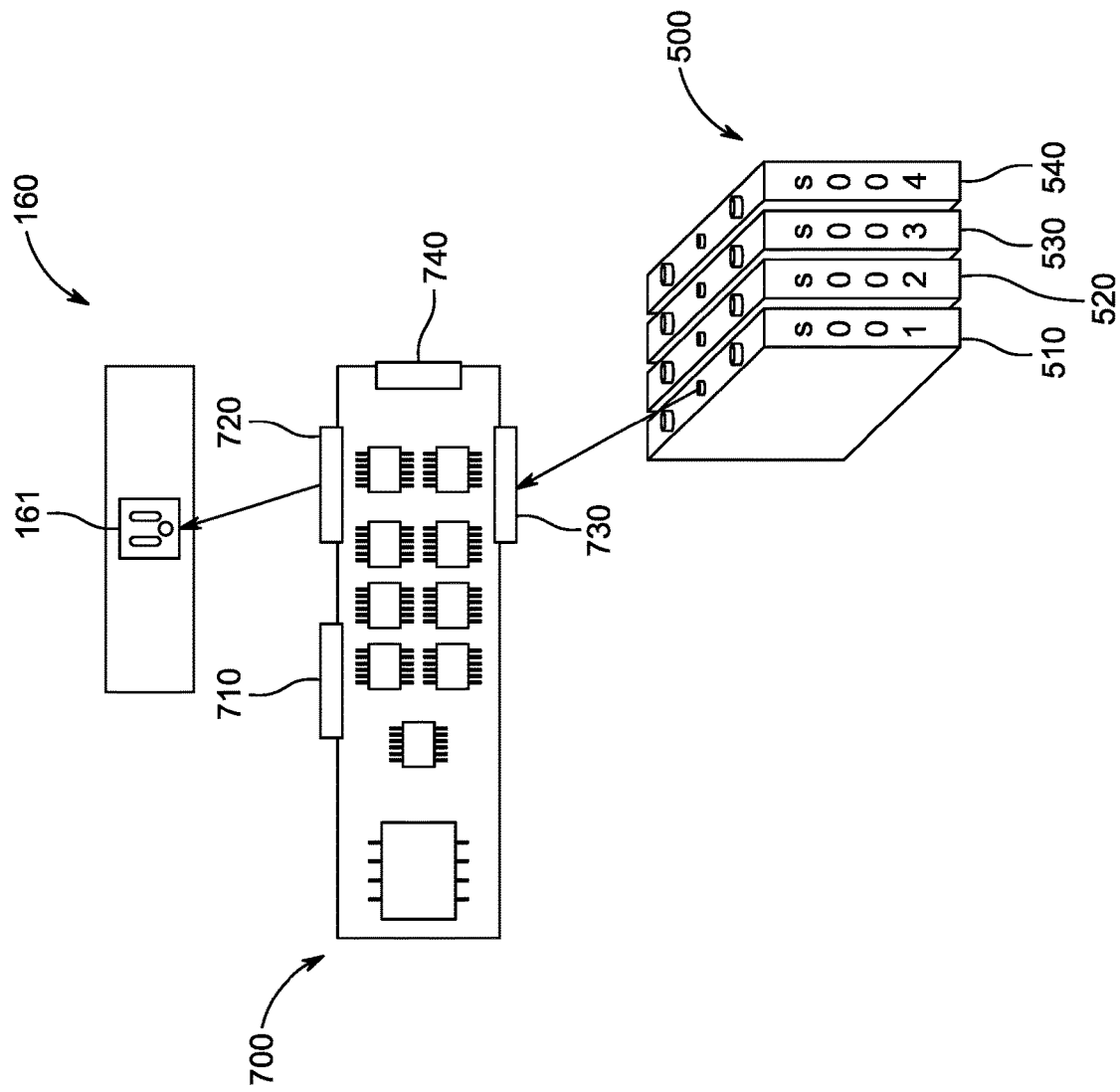

FIG. 24 is an illustration of an example flow of power from a battery module through an output port and a main battery management printed circuit board assembly.

Figure 25:
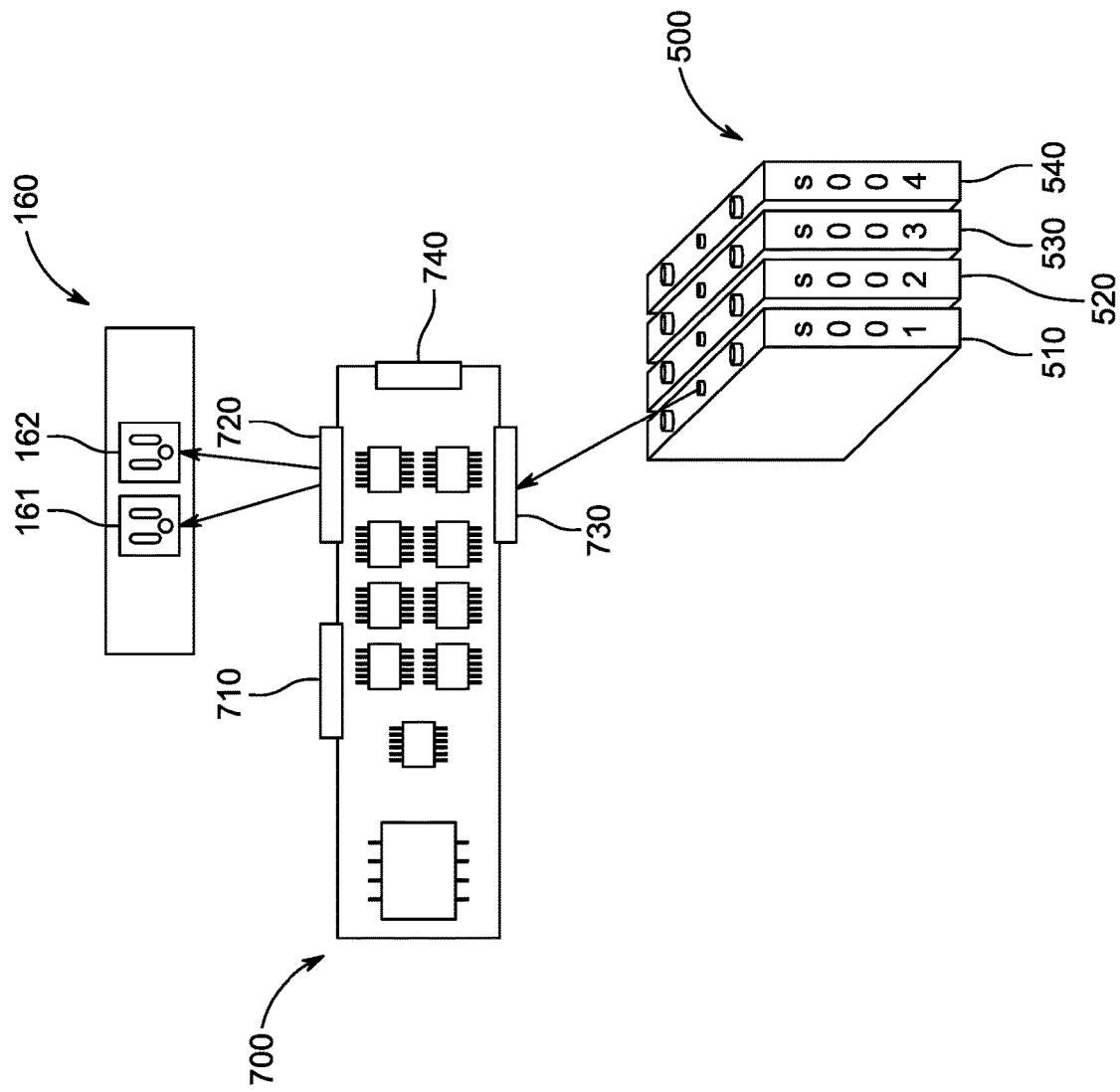

FIG. 25 is an illustration of an example flow of power from a battery module through two output ports and a main battery management printed circuit board assembly.

Figure 26:
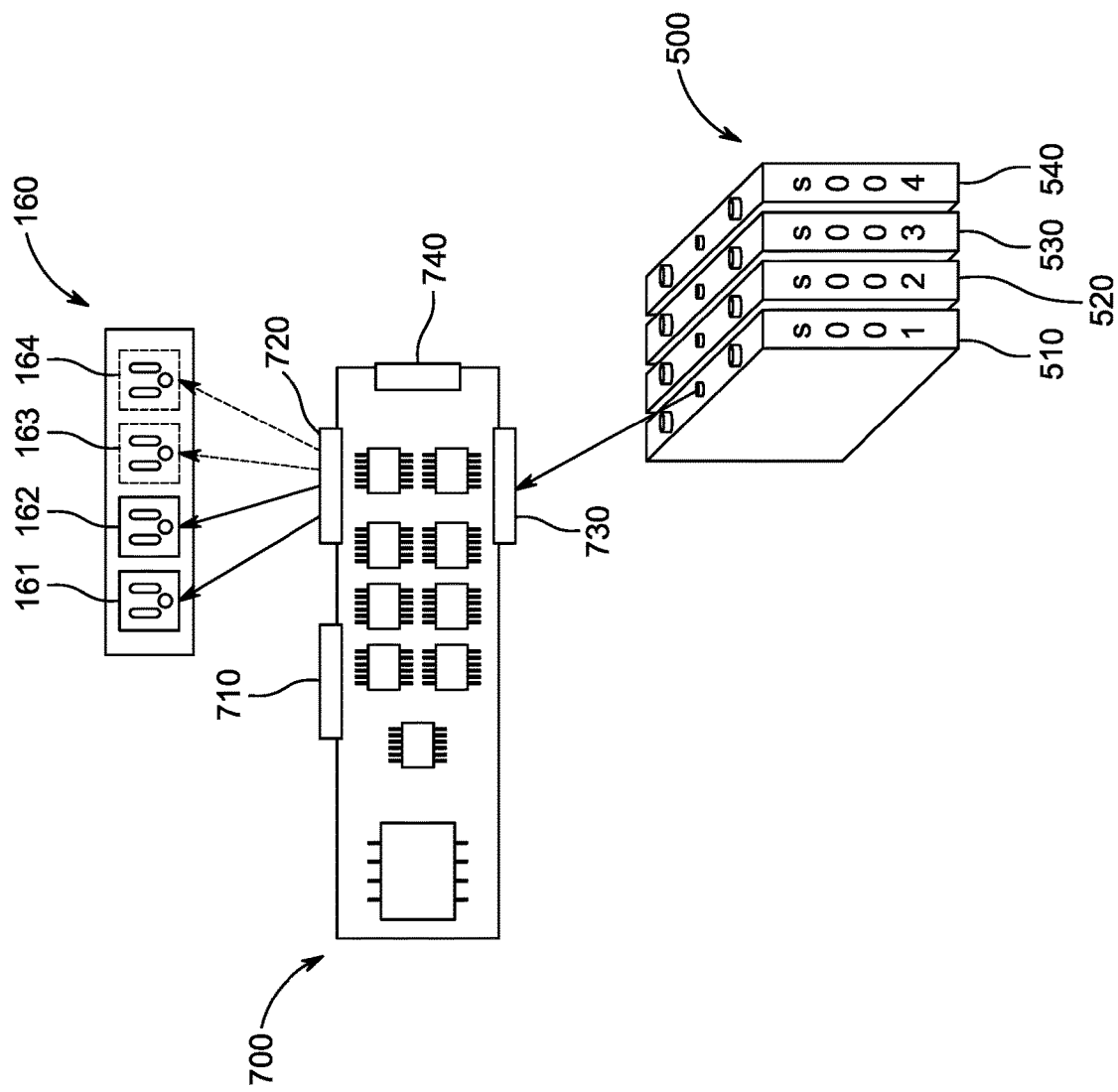

FIG. 26 is an illustration of an example flow of power from a battery module through multiple output ports and a main battery management printed circuit board assembly.

Figure 27:
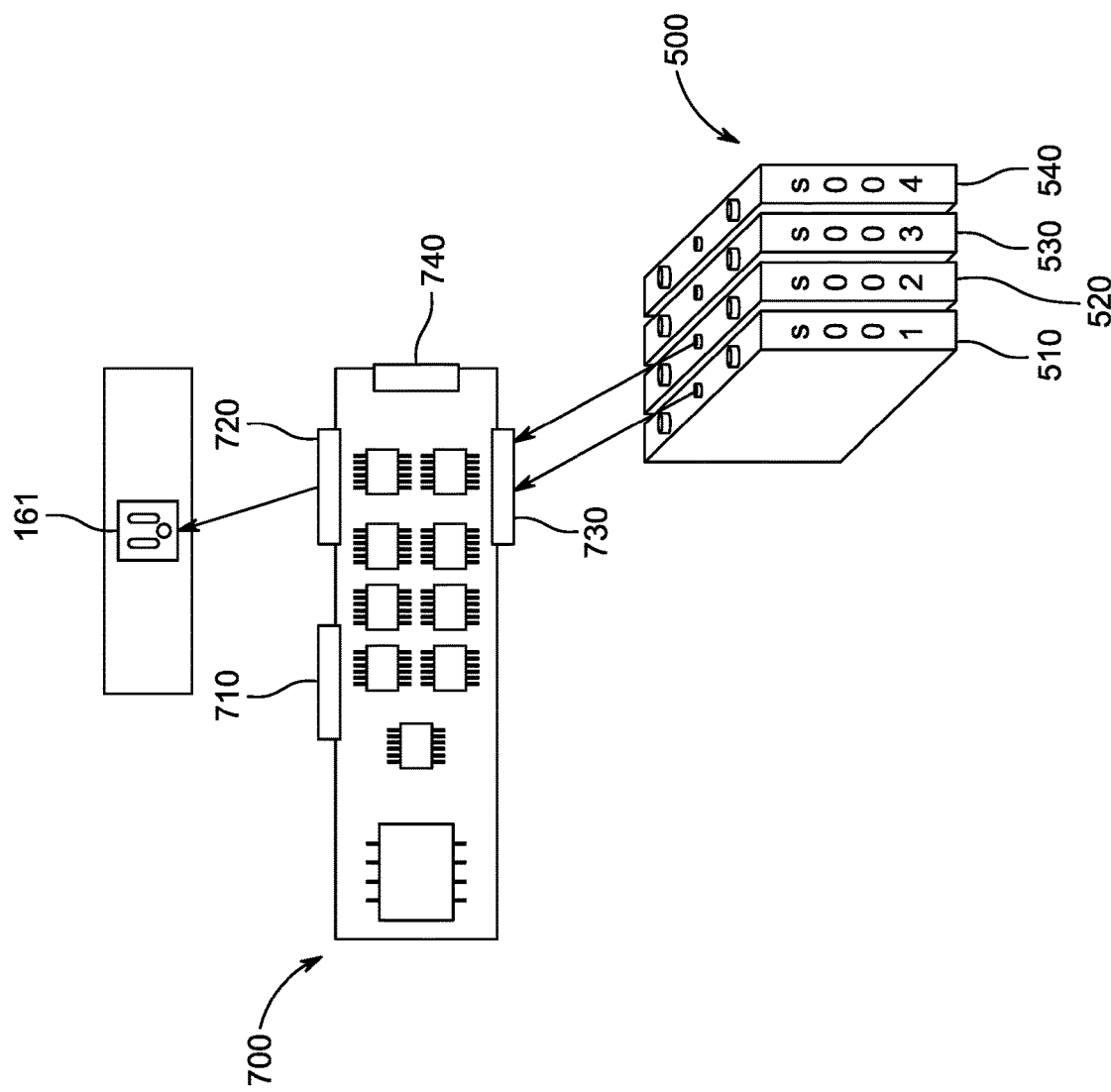

FIG. 27 is an illustration of an example flow of power from two battery modules through an output port and a main battery management printed circuit board assembly.

Figure 28:
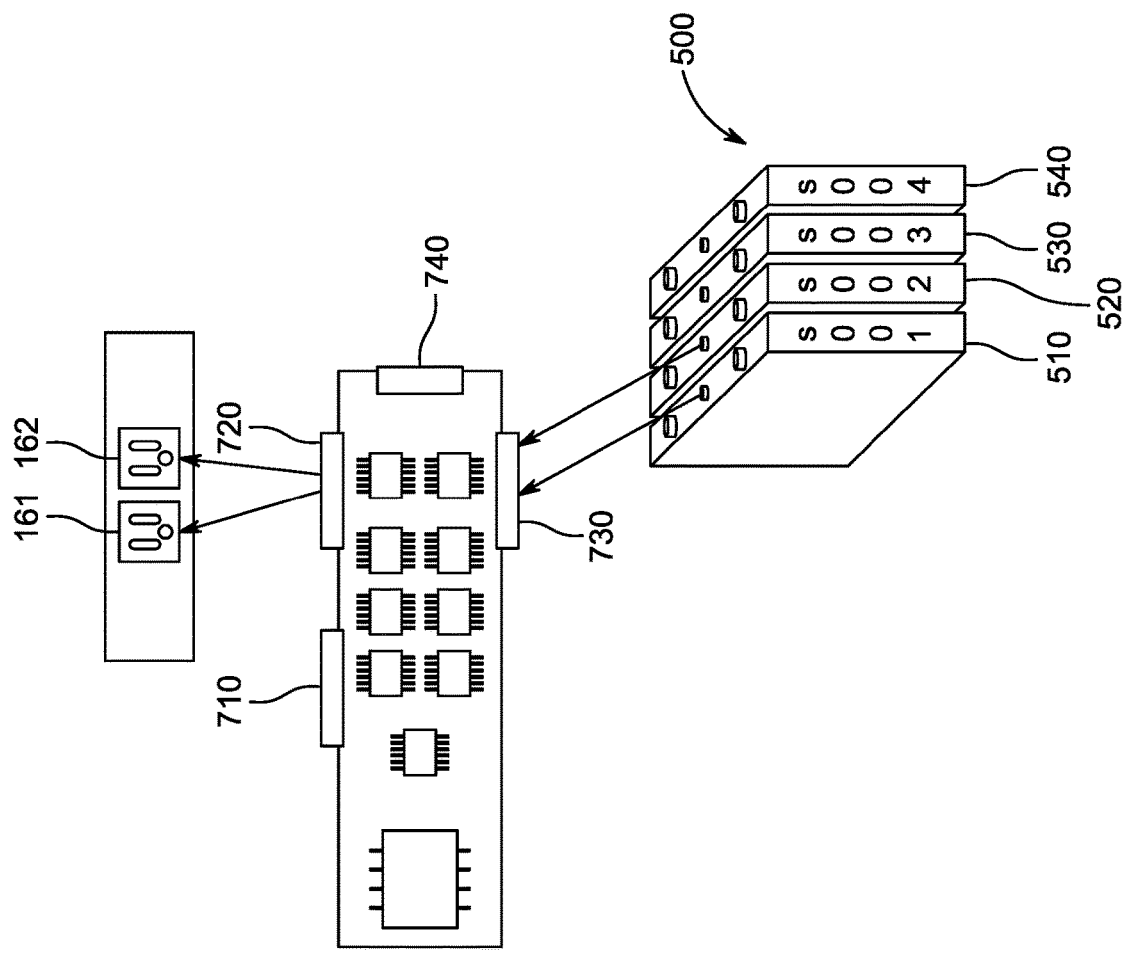

FIG. 28 is an illustration of an example flow of power from two battery modules through two output ports and a main battery management printed circuit board assembly.

Figure 29:
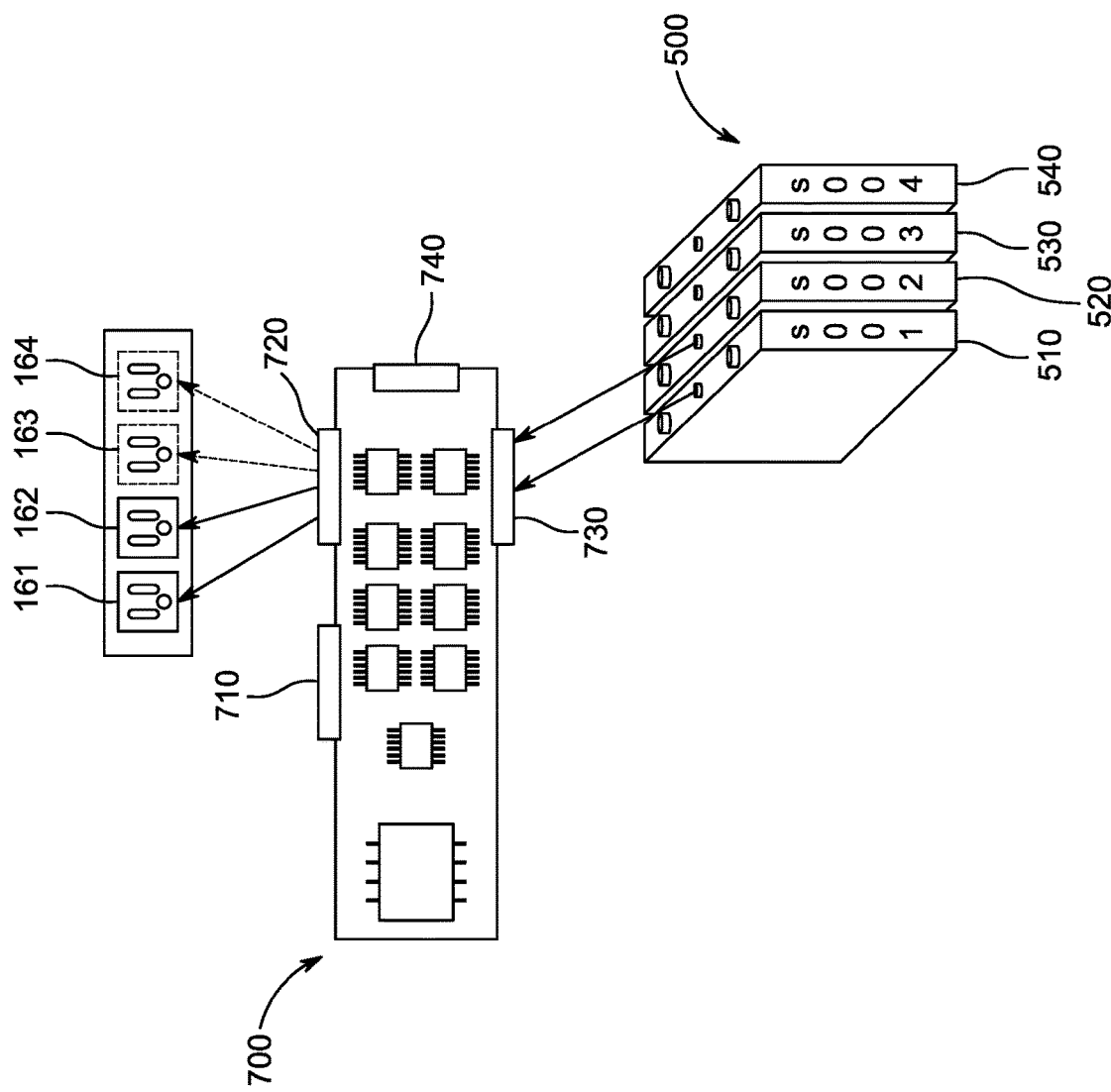

FIG. 29 is an illustration of an example flow of power from two battery modules through a plurality of output ports and a main battery management printed circuit board assembly.

Figure 30:
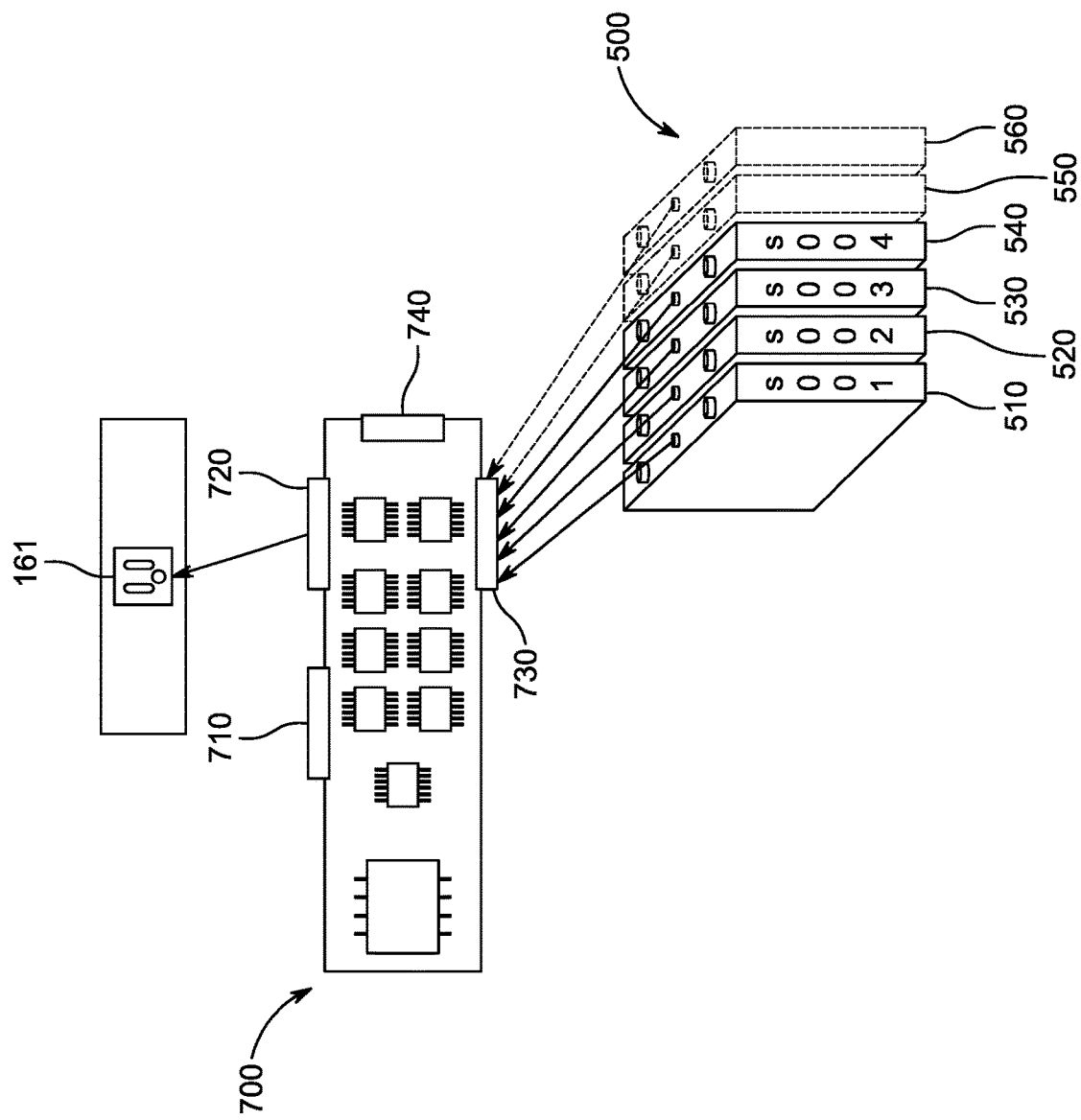

FIG. 30 is an illustration of an example flow of power from a plurality of battery modules through an output port and a main battery management printed circuit board assembly.

Figure 31:
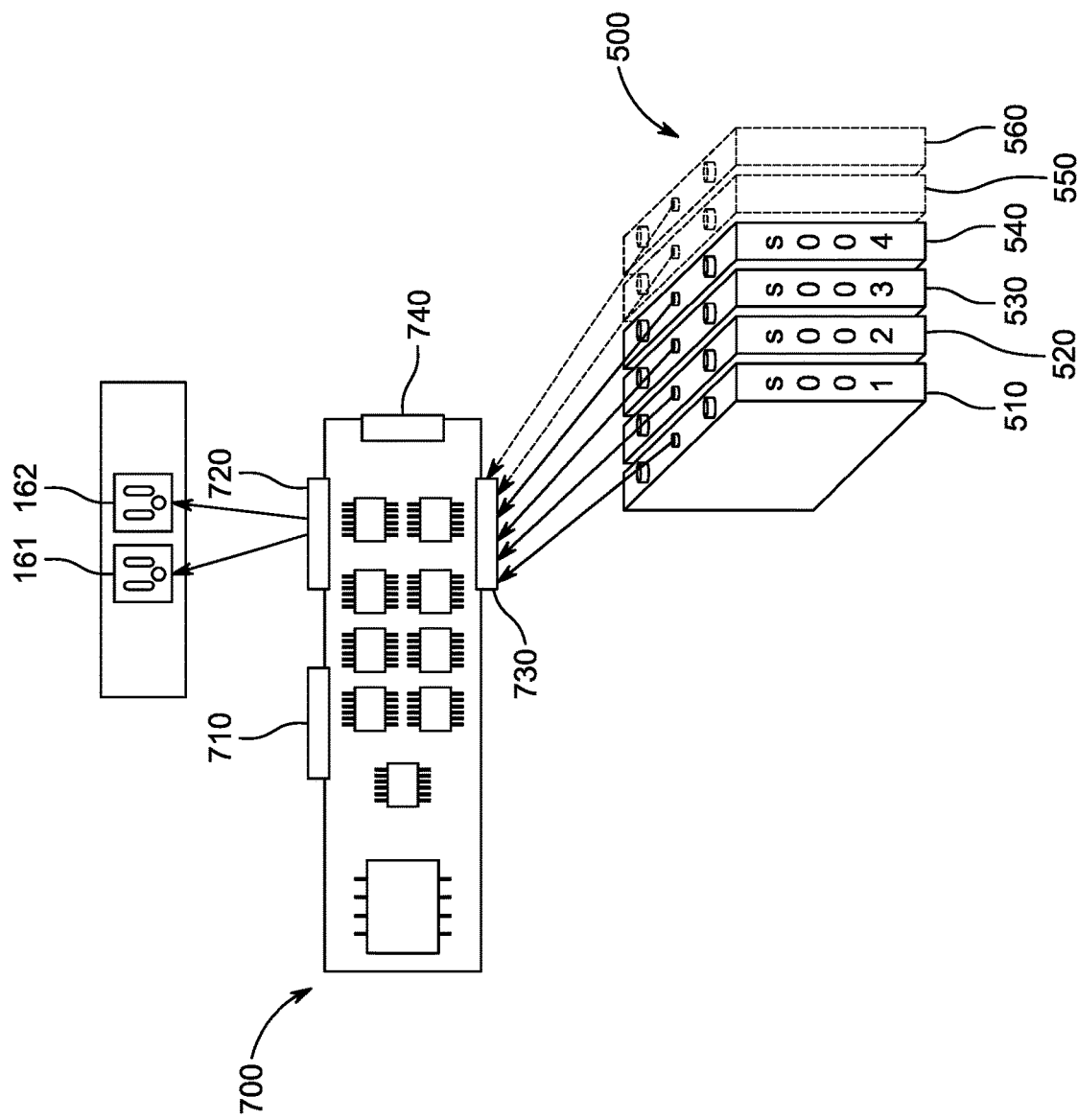

FIG. 31 is an illustration of an example flow of power from a plurality of battery modules through two output ports and a main battery management printed circuit board assembly.

Figure 32:
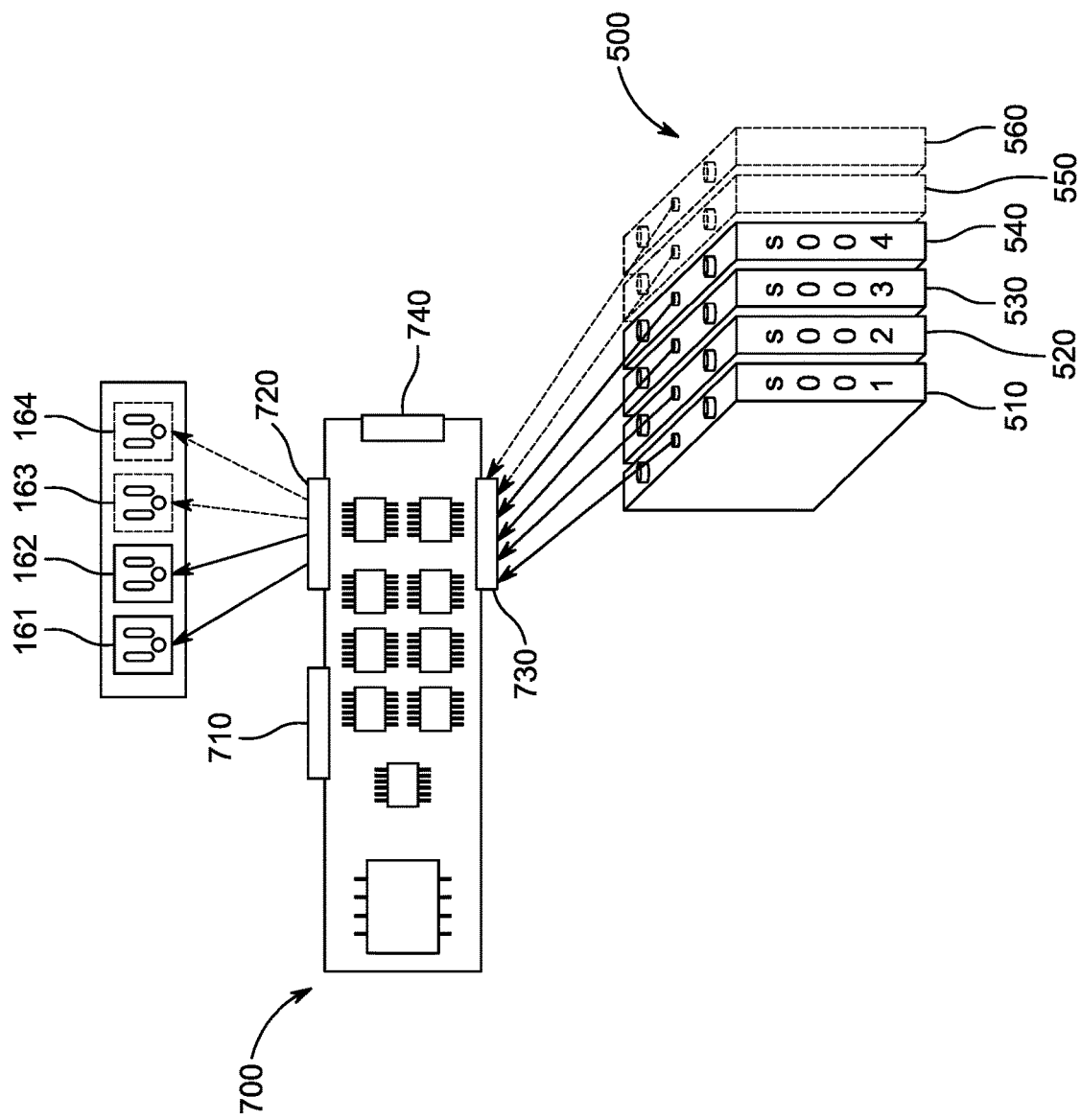

FIG. 32 is an illustration of an example flow of power from a plurality of battery modules through a plurality of output ports and a main battery management printed circuit board assembly.

Figure 33:
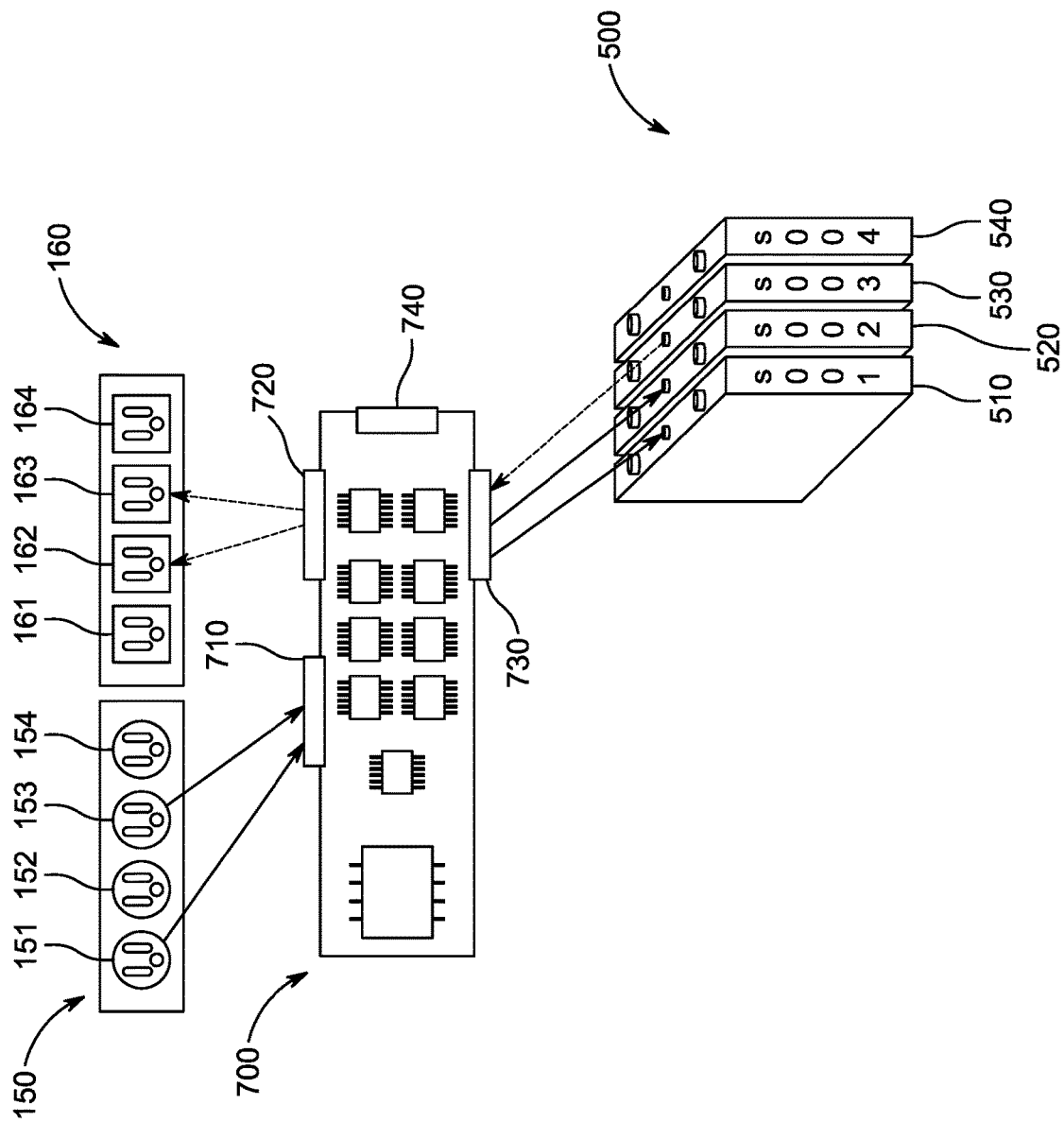

FIG. 33 is an illustration of an example flow of power from a plurality of input ports through a plurality of battery modules, a plurality of output ports, and a main battery management printed circuit board assembly.

Figure 34:
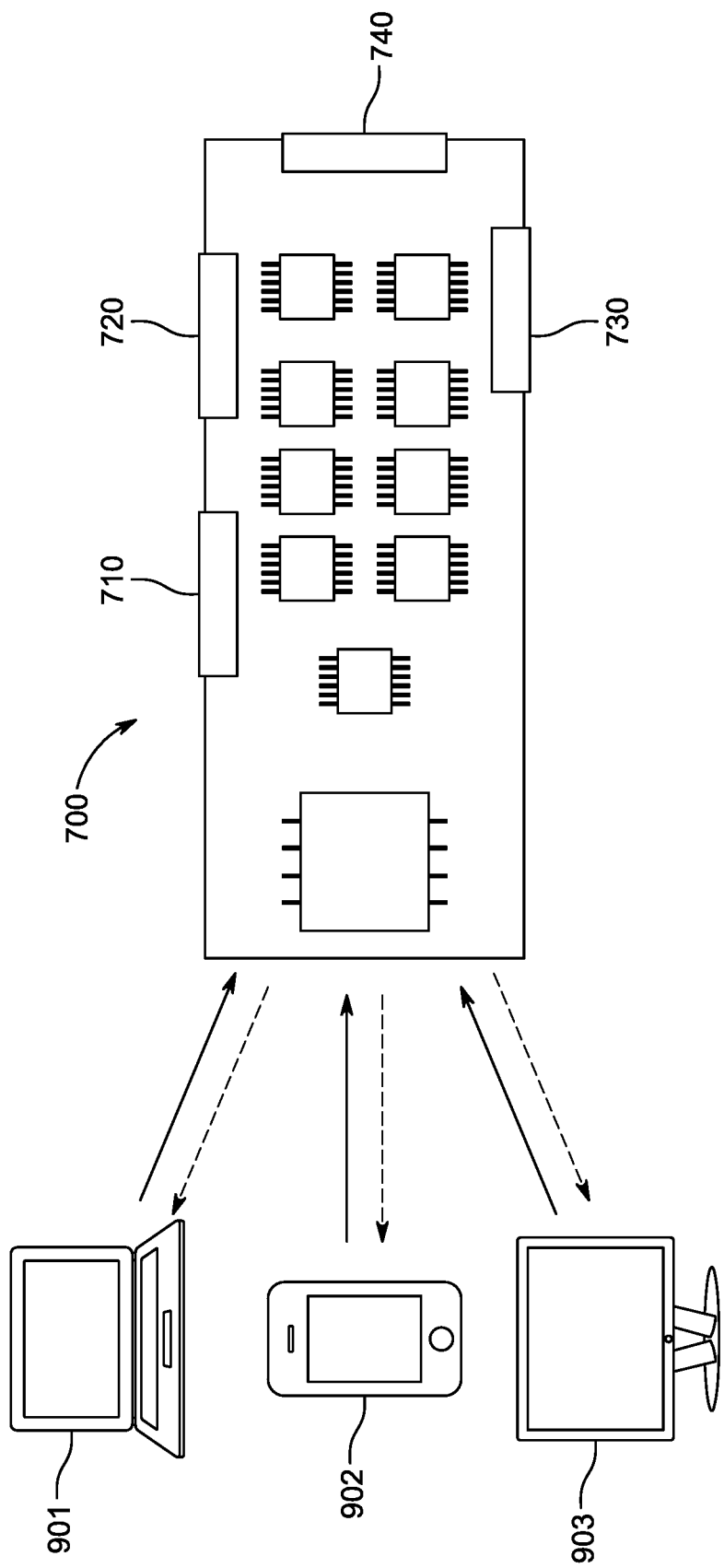

FIG. 34 illustrates an example flow of information through an embodiment where an external computing system, such as a handheld device, is connected to a main battery management printed circuit board assembly.

Figure 35:
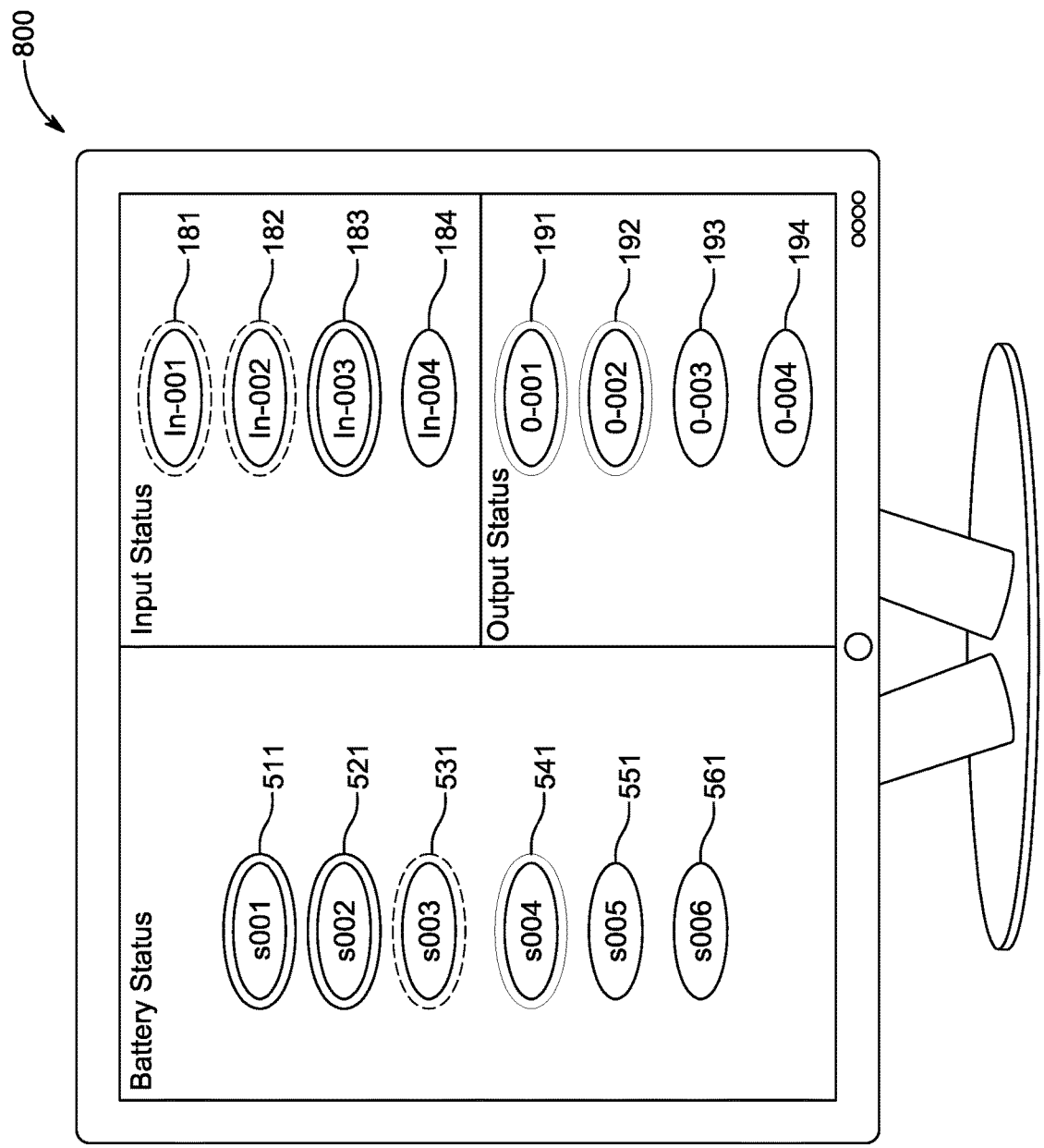

FIG. 35 is an illustration of an example embodiment in which the user interface displays the charging and discharging status from the input ports, battery modules, and output ports.

Figure 36:
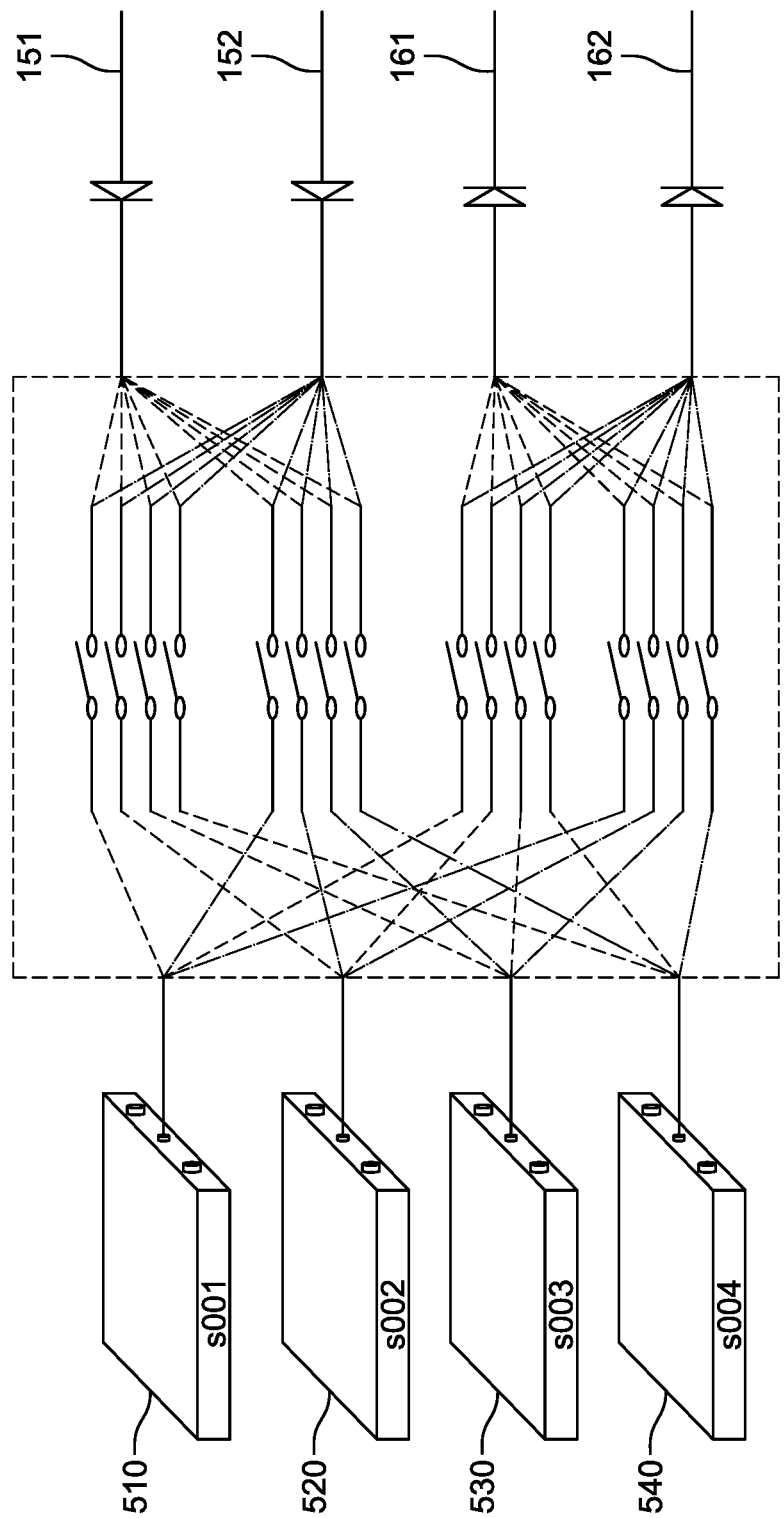
Figures 1, 36:
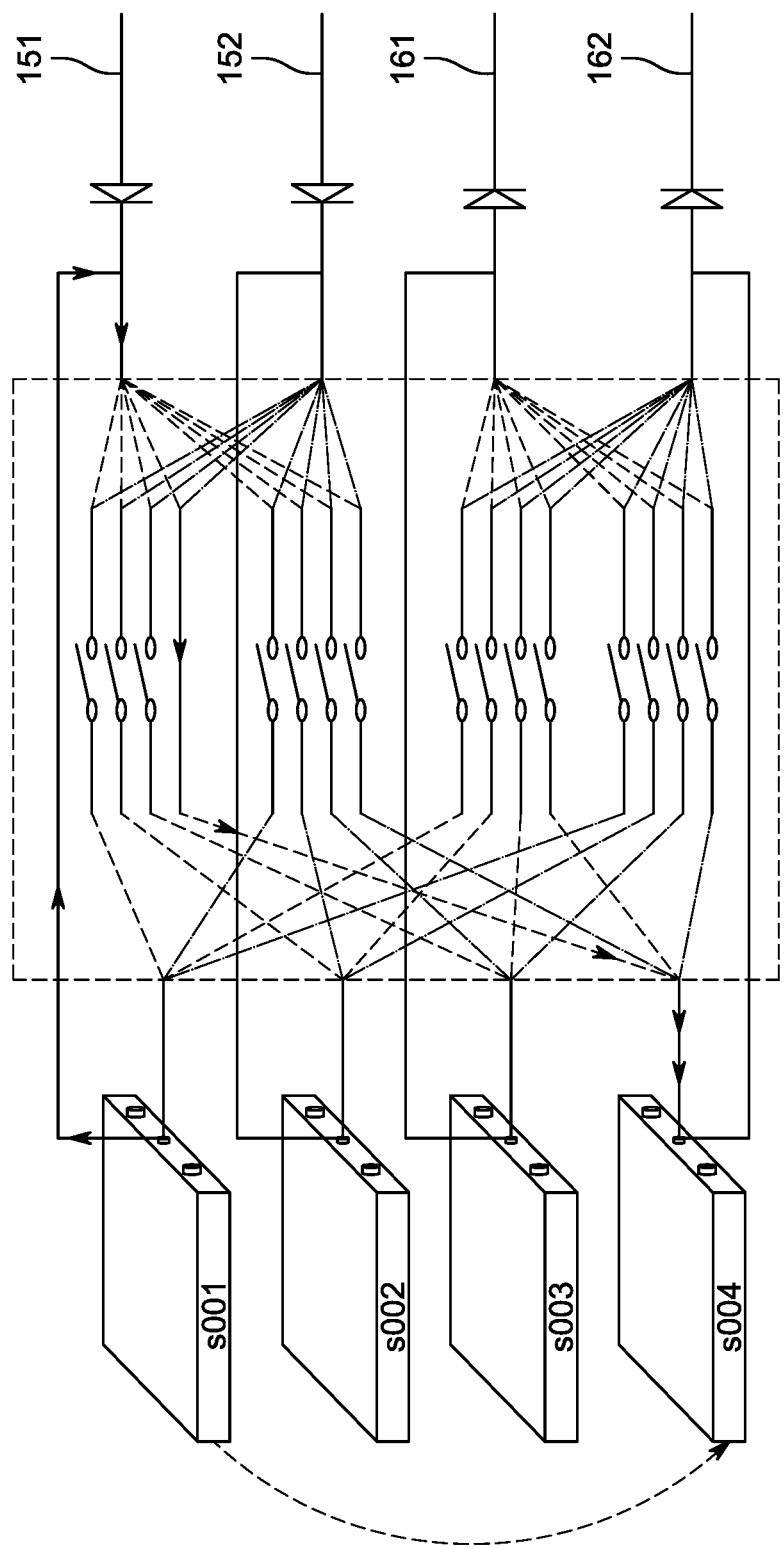

FIG. 36 is an illustration of an example embodiment wherein input ports, battery modules, and output ports are connected through a switching matrix.

FIG. 36-1 is an illustration of an example embodiment where the switching matrix of FIG. 36 can also be used to connect battery modules to each other, such that one or more battery modules can charge one or more other battery modules.

Figure 37:
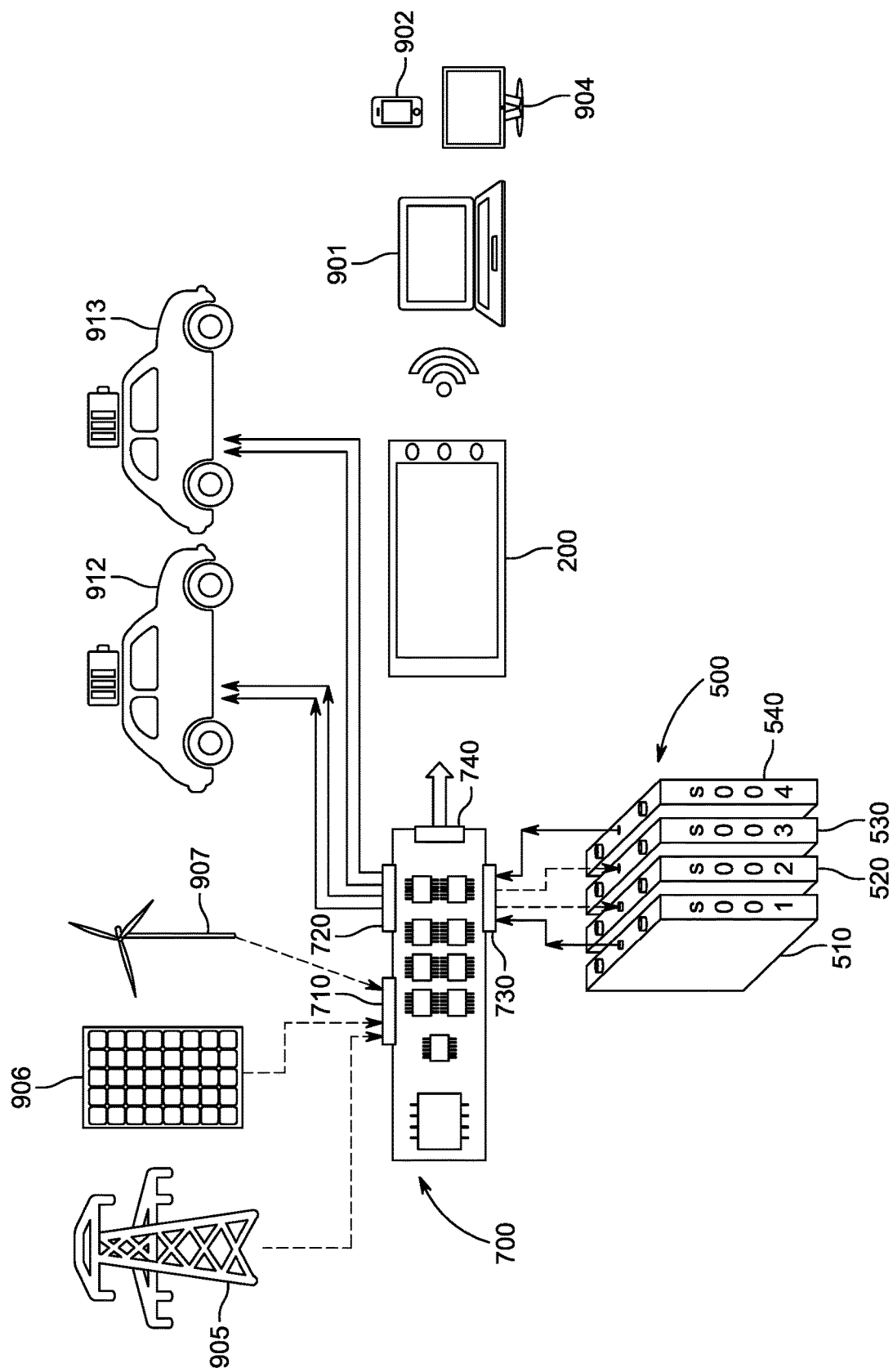
Figures 1, 37:
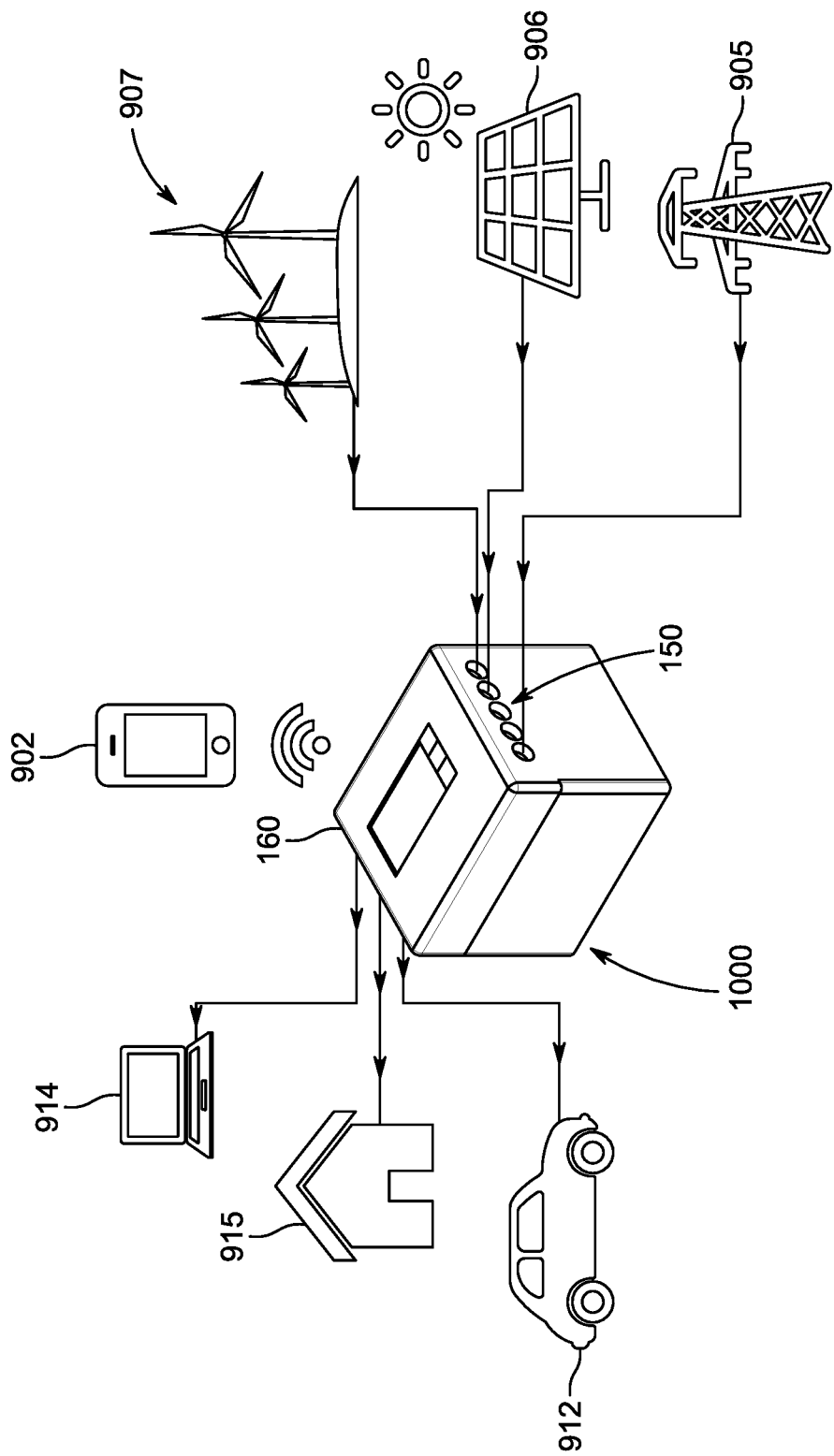

FIG. 37 is an illustration of an example embodiment where the power levels of charging through a plurality of input ports and discharging through a plurality of output ports are monitored and controlled with a computing system.

FIG. 37-1 is an illustration of an example embodiment where the power levels of charging through a plurality of input ports and discharging through a plurality of output ports are monitored and controlled with a computing system.

Figure 38:
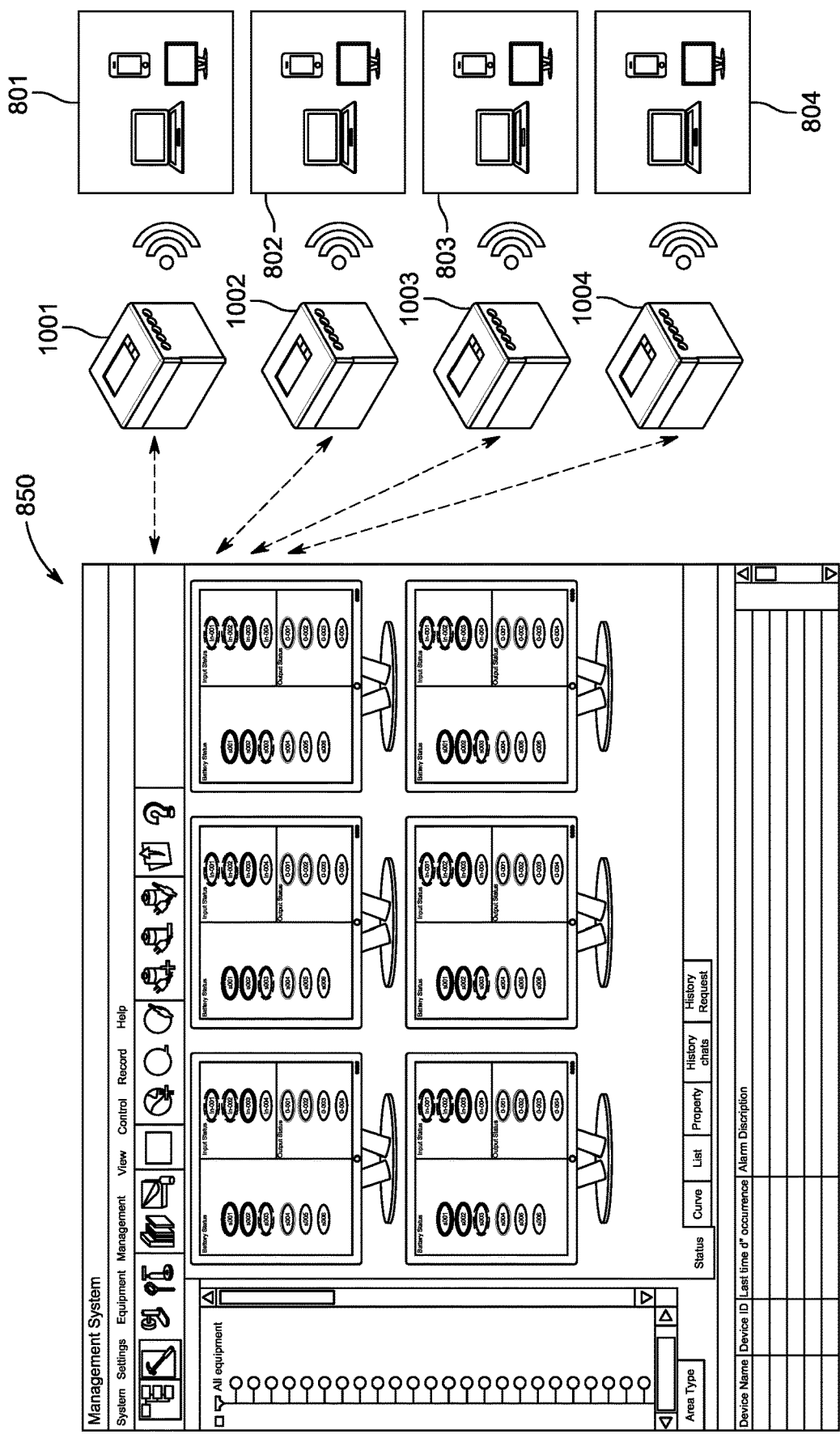

FIG. 38 is an illustration of an example embodiment of a master system where the user can see and control the status of a plurality of chargeable energy systems connected to the master system.

Figure 39:
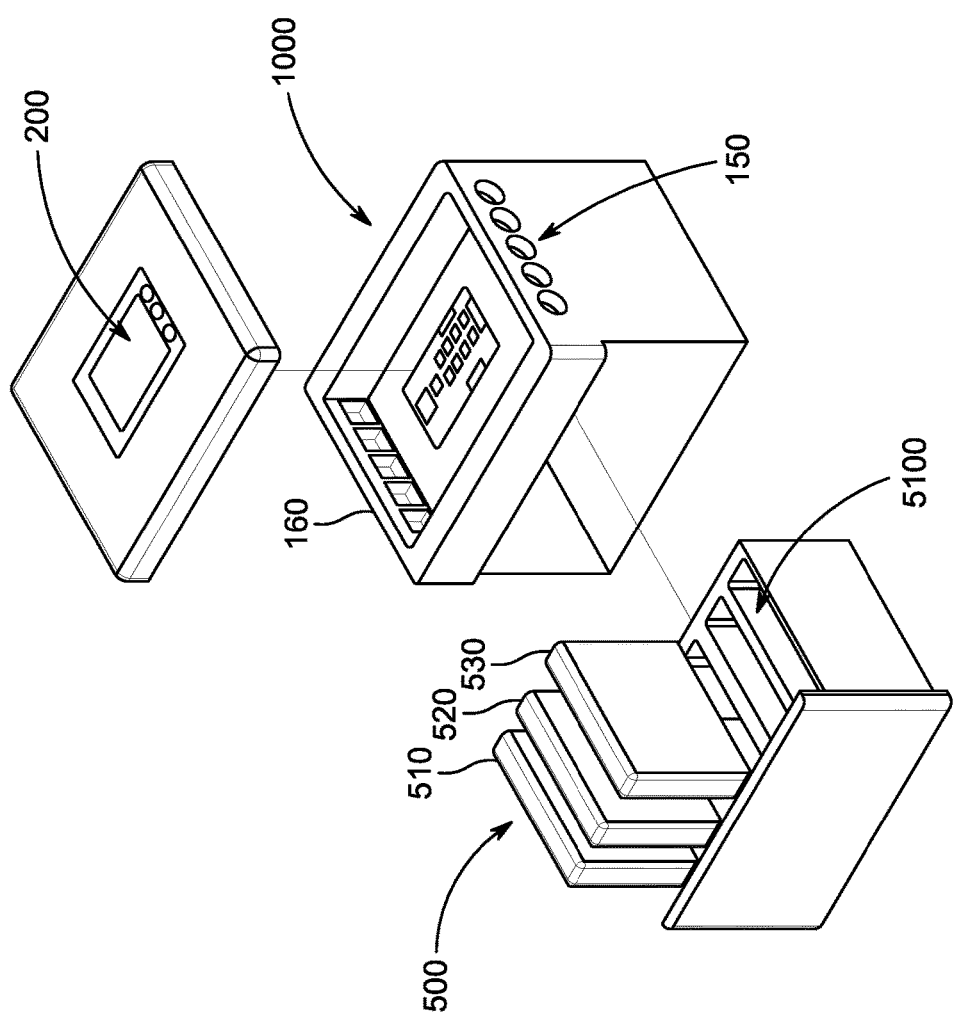

FIG. 39 is an illustration of an example embodiment of the external housing of the system with an expandable slot permitting the user to upgrade and substitute battery modules.

DETAILED DESCRIPTION

The present disclosure provides for fast charging of energy storage systems, such as battery systems, and in certain embodiments optimizes the usage of energy stored in these systems by leveraging a programmable control chip ("PCC") printed circuit board assembly which can be configured by a user to control the flow of input power, the flow of output power, and the operation of a plurality of battery modules. The present disclosure describes various example means by which the inputs, outputs, and constituent battery modules can be operated independently of each other, and which are configurable to achieve a variety of user-specified purposes. Benefits of systems according to certain embodiments include: expedited charge times of the battery modules; priority management for the charging of each battery module; a flexible design facilitating simple expansion and substitution of non-uniform battery modules and new sources of input power, such as wind and solar; priority management for power output to a plurality of connected loads; increased useful lifetimes of each of the battery modules; and simplified maintenance and service through an efficient design.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

Overview of Figures

FIG. 1 is an illustration of an example system 100 according to one embodiment of the present disclosure. The system 100 comprises an external housing 1000, a status indicator 200, and a plurality of battery modules 500 which can be charged through one or more of a plurality of input ports 150, and discharged through one or more of a plurality of output ports 160. In the present description, input ports and output ports may be referred to generally with numerals 150 and 160 respectively, and referred to individually with numerals in the form of 151, 152, . . . and 161, 162 . . . . Input and output ports may also be referred to as input and output sockets.

Figure 2:
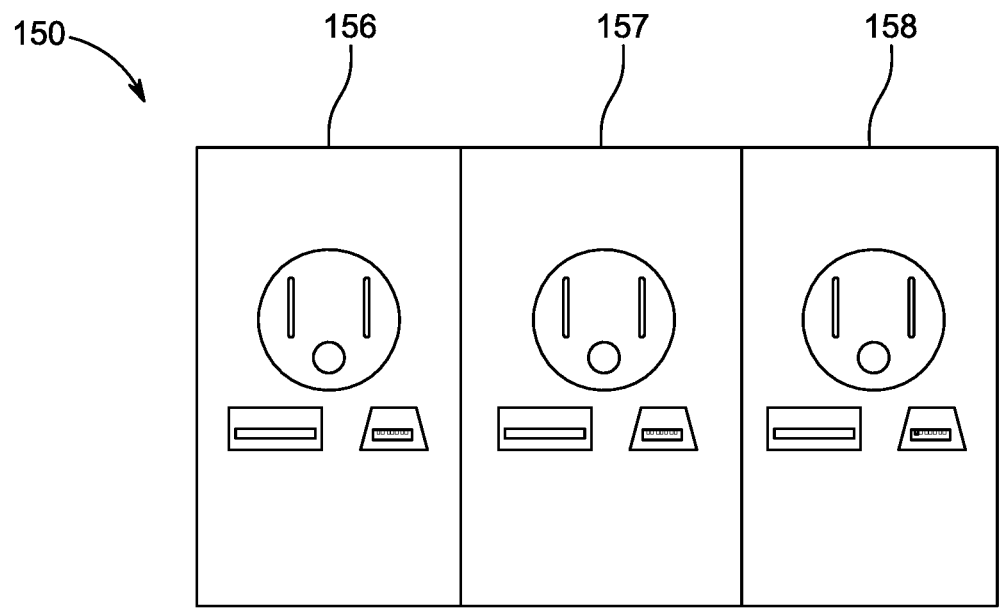
FIG. 2 illustrates the input ports used for charging the system of FIG. 1.

In the illustrated example of FIG. 1 the input ports 150 comprise five input ports 151, 152, 153, 154 and 155. FIG. 2 is an illustration of example input ports 150 and a plurality of additional input sockets 156, 157, 158. In some embodiments, each input socket could be different from the others to support a broad array of electrical devices. For example, the input sockets could support a North American AC plug, a standard USB port, or any other different type of plug or input.

Figure 3:
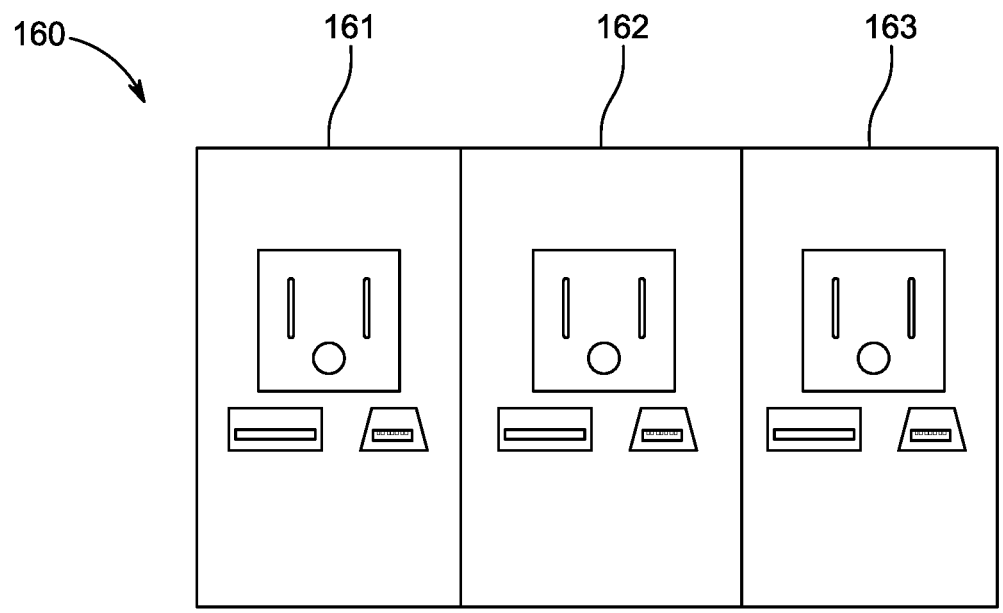
FIG. 3 illustrates the output ports used for discharging the system of FIG. 1.

FIG. 3 is an illustration of example output ports 160 comprising a plurality of output sockets 161, 162, 163. In an embodiment, each output socket could be different from the others to support a broad array of electrical devices. For example, the output sockets could support a North American AC plug, a standard USB port, or any other different type of plug or output.

Figure 4:
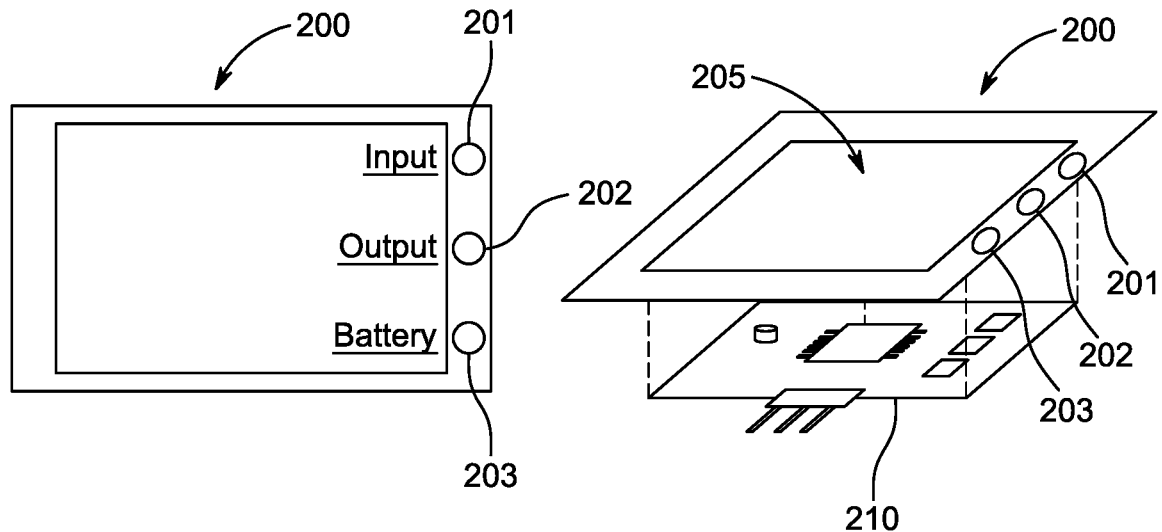

FIG. 4 is an illustration of an example status indicator 200. The indicator has a display screen 205 and printed circuit board assembly 210 which controls the data displayed by the indicator.

Figure 5:
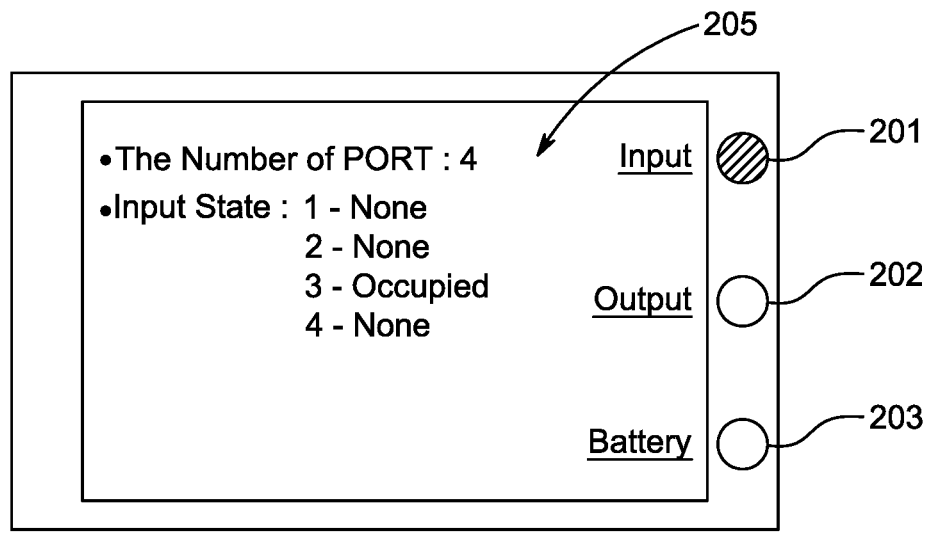

FIG. 5 is an illustration of an example status indicator displaying input information. In one embodiment, where a particular input button 201 is active, the status indicator display screen 205 shows certain information associated with that input to the user.

Figure 6:
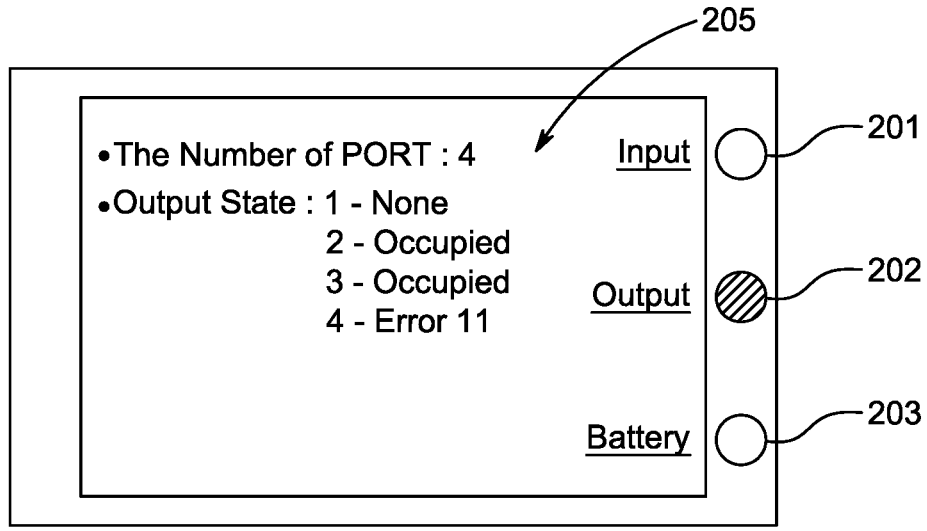

FIG. 6 is an illustration of an example status indicator displaying output information. In one embodiment, where a particular output button 202 is active, the status indicator display screen 205 shows certain information associated with that output to the user.

Figure 7:
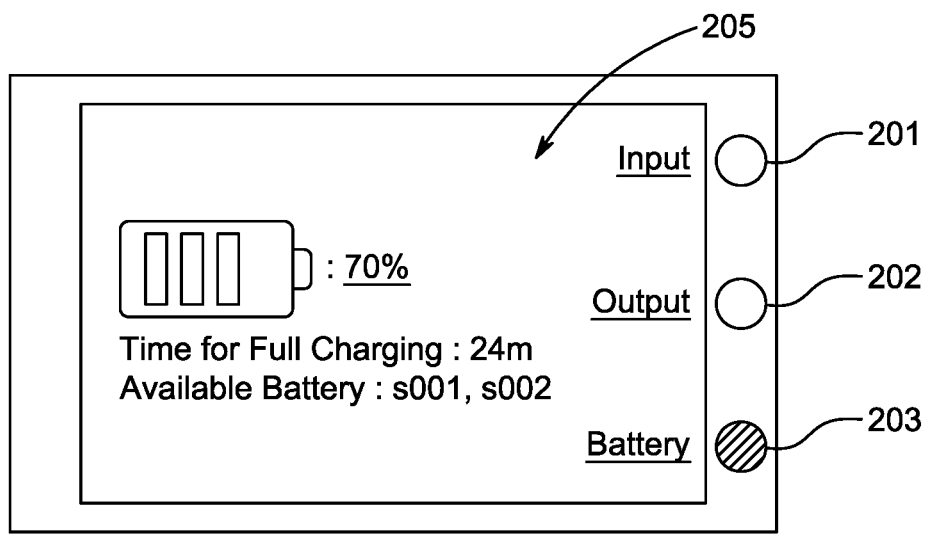

FIG. 7 is an illustration of an example status indicator displaying battery module information. In one embodiment, where a particular battery button 203 is active, the status indicator display screen 205 shows certain information associated with that battery module to the user.

FIG. 8 is an illustration of an example battery module 500. The battery module has within it a plurality of battery cells 501 and a slave battery management system 505. The slave battery management system 505 manages the battery module 500 and communicates with main battery management printed circuit board assembly 700 (see FIG. 10).

FIG. 9 is an illustration of a plurality of battery modules 500. In the present description, battery modules may be referred to generally with numeral 500, and referred to individually with numerals in the form of 510, 520, . . . . In some embodiments, each battery module 510, 520, 530, and 540 has its own battery cell(s) 501 and slave battery management system 505 (see FIG. 8). In some embodiments, each of the battery modules are independent from each other and there are no dependencies between any two battery modules.

FIG. 10 is a block diagram of an example main battery management printed circuit board assembly 700 according to some embodiments of the present disclosure. The assembly 700 comprises a main programmable control chip 701, an input connection 710, an output connection 720, a battery module connection 730, a status indicator connection 740, and a plurality of other parts 790 (such as, for example, other integrated circuits, resistors, capacitors, regulators, and so on). In an embodiment, this main battery management printed circuit board assembly 700 controls the input and output of battery power to and from the system and displays the status on the status indicator display screen 200.

FIG. 10-1 schematically illustrates the main functionality of the main battery management printed circuit board assembly 700. The assembly 700 controls the inputs 151, 152, 153, and 154 through a connection 710 and controls the outputs 161, 162, 163, and 164 through a different connection 720. The assembly also controls battery modules 510, 520, 530, 540 and potentially upgraded modules 550, 560. Further, in some embodiments, a status indicator 200 is employed to show the status of each input port, output port, and battery module. In some embodiments, each battery module has its own serial number or other unique identifier used to identify the status of each battery module.

FIG. 11 is an illustration of the flow of information throughout an example system as it traverses the battery module 500 and status indicator 200 through the main battery management printed circuit board assembly 700. While this information flows, the connections 730 and 740 are active.

FIG. 12 is an illustration of the flow of information throughout an example system as it traverses the input 150 to the status indicator 200 through the main battery management printed circuit board assembly 700. While this information flows, the connections 710 and 740 are active.

FIG. 13 an illustration of the flow of information throughout an example system as it traverses the output 160 to the status indicator 200 through the main battery management printed circuit board assembly 700. While this information flows, the connections 720 and 740 are active.

FIG. 14 is an illustration of an example system's overall functionality transferring electrical power among the input ports 150, the battery modules 500, and the output port 160, through the main battery management printed circuit board assembly 700.

FIG. 15 is an illustration showing how an example system can be configured to provide electrical current from the input 151 to charge a battery module 510 via the main battery management printed circuit board assembly 700. The main battery management printed circuit board assembly 700 is configured such that this particular input 151 is only charging one battery module 510.

FIG. 16 is an illustration showing how an example system can be configured to provide electrical current from the input 151 to charge two battery modules 510 and 520 via the main battery management printed circuit board assembly 700. The main battery management printed circuit board assembly 700 is configured such that this particular input 151 is charging two battery modules 510 and 520.

FIG. 17 is an illustration showing how an example system can be configured to provide electrical current from the input 151 and charge a plurality of battery modules 510, 520, 530, and 540 as well as potentially-upgradable modules 550 and 560 via the main battery management printed circuit board assembly 700. The main battery management printed circuit board assembly 700 is configured such that this particular input 151 is charging a plurality of battery modules.

FIG. 18 is an illustration showing how an example system can be configured to provide electrical current from two inputs 151 and 152, to charge a battery module 510 via the main battery management printed circuit board assembly 700. The main battery management printed circuit board assembly 700 is configured such that the two particular inputs 151 and 152 are only charging one battery module 510.

FIG. 19 is an illustration showing how an example system can be configured to provide electrical current from two inputs 151 and 152 to charge two battery modules 510 and 520 via the main battery management printed circuit board assembly 700. The main battery management printed circuit board assembly 700 is configured such that the two particular inputs 151 and 152 are charging two battery modules 510 and 520.

FIG. 20 is an illustration showing how an example system can be configured to provide electrical current from two inputs 151 and 152 to charge a plurality of battery modules 510, 520, 530, 540 as well as a potential battery module 550 via the main battery management printed circuit board assembly 700. The main battery management printed circuit board assembly 700 is configured such that the two particular inputs 151 and 152 are charging a plurality of battery modules.

FIG. 21 is an illustration showing how an example system can be configured to provide electrical current from a plurality of inputs 151, 152, 153, and 154 to charge a battery module 510 via the main battery management printed circuit board assembly 700. The main battery management printed circuit board assembly 700 is configured such that a plurality of inputs are together only charging the particular battery module 510.

FIG. 22 is an illustration showing how an example system can be configured to provide electrical current from a plurality of inputs 151, 152, 153, and 154 to charge two battery modules 510 and 520 via the main battery management printed circuit board assembly 700. The main battery management printed circuit board assembly 700 is configured such that a plurality of multiple inputs are together only charging the two particular battery modules 510 and 520.

FIG. 23 is an illustration showing how an example system can be configured to provide electrical current from a plurality of inputs 151, 152, 153, and 154 to charge a plurality of battery modules 510, 520, 530, and 540 and potentially-upgradable modules 550 and 560 via the main battery management printed circuit board assembly 700. The assembly main battery management printed circuit board 700 is configured such that a plurality of inputs are together charging a plurality of battery modules.

FIG. 24 is an illustration showing how an example system can be configured to provide electrical current from a battery module 510 and discharging through an output 161 via the main battery management printed circuit board assembly 700. The main battery management printed circuit board assembly 700 is configured such that only battery module 510 is being discharged through one particular output 161.

FIG. 25 is an illustration showing how an example system can be configured to provide electrical current from a battery module 510 and discharging through two outputs 161 and 162 via the main battery management printed circuit board assembly 700. The main battery management printed circuit board assembly 700 is configured such that only battery module 510 is being discharged through the two outputs 161 and 162.

FIG. 26 is an illustration showing how an example system can be configured to provide electrical current from a battery module 510 and discharging through a plurality of outputs 161, 162, 163, and 164 via the main battery management printed circuit board assembly 700. The main battery management printed circuit board assembly 700 is configured such that only one battery module 510 is being discharged through the plurality of outputs 161, 162, 163, and 164.

FIG. 27 is an illustration showing how an example system can be configured to provide electrical current from two battery modules 510 and 520 and discharging through one output 161 via the main battery management printed circuit board assembly 700. The main battery management printed circuit board assembly 700 is configured such that only the two battery modules 510 and 520 are being discharged through the particular output 161.

FIG. 28 is an illustration showing how an example system can be configured to provide electrical current from two battery modules 510 and 520 and discharging through two outputs 161 and 162 via the main battery management printed circuit board assembly 700. The main battery management printed circuit board assembly 700 is configured such that only the two battery modules 510 and 520 are being discharged by the two outputs 161 and 162.

FIG. 29 is an illustration showing how an example system can be configured to provide electrical current from two battery modules 510 and 520 and discharging through a plurality of outputs 161, 162, 163, and 164 via the main battery management printed circuit board assembly 700. The main battery management printed circuit board assembly 700 is configured such that only the two battery modules 510 and 520 are being discharged through the plurality of outputs.

FIG. 30 is an illustration showing how an example system can be configured to provide electrical current from a plurality of battery modules 510, 520, 530, and 540 and potentially-upgradable battery modules 550 and 560 and discharging through an output 161 via the main battery management printed circuit board assembly 700. The main battery management printed circuit board assembly 700 is configured such that the plurality of battery modules are being discharged through only one output 161.

FIG. 31 is an illustration showing how an example system can be configured to provide electrical current from a plurality of battery modules 510, 520, 530, and 540 and potentially-upgradable battery modules 550 and 560 and discharging through two outputs 161 and 162 via the main battery management printed circuit board assembly 700. The main battery management printed circuit board assembly 700 is configured such that the plurality of battery modules are being discharged through only the two particular outputs 161 and 162.

FIG. 32 is an illustration showing how an example system can be configured to provide electrical current from a plurality of battery modules 510, 520, 530, and 540 and potentially-upgradable battery modules 550 and 560 and discharging through a plurality of outputs 161, 162, 163, and 164 via the main battery management printed circuit board assembly 700. The main battery management printed circuit board assembly 700 is configured such that the plurality of battery modules are being discharged by a plurality of outputs.

FIG. 33 is an illustration showing how an example system can be configured to provide electrical current from a plurality of inputs to a plurality of battery modules, and from the battery modules to a plurality of outputs, via the main battery management printed circuit board assembly 700.

FIG. 34 is an illustration of the connection of an external management system to the main battery management printed circuit board assembly 700. In some embodiments, this management system could be operated by a regular computing system of an external device such as, for example, a laptop 901, smartphone 902, and/or desktop computer 903. The connection between the main battery management printed circuit board assembly 700 and an external device could be a hardwired connection, a wireless connection, or some combination thereof.

FIG. 35 is an illustration of an example external management system 800 operatively connected to the main battery management printed circuit board assembly 700. In an embodiment, the user interface of the system 800 indicates the status of a plurality of inputs 181, 182, 183, and 184, the status of a plurality of battery modules 511, 521, 531, 541, 551, and 561, and the status of a plurality of outputs 191, 192, 193, and 194.

FIG. 36 is an illustration of a basic embodiment of an example switching matrix of a control system of the main battery management printed circuit board assembly 700. In an example embodiment, the inputs 151/1521 could be connected to any one or all of a plurality of battery modules, and one or more battery modules could be connected to any of output 161/162 via instructions from the main battery management printed circuit board assembly 700.

FIG. 36-1 is an illustration of another embodiment of an example switching matrix of the control system of the main battery management printed circuit board assembly 700. In an example embodiment, each of the plurality of battery modules can be connected to one or more other battery modules for charging one or more other battery modules via instructions from the main battery management printed circuit board assembly 700.

FIG. 37 is an illustration of an example system where a plurality of input power sources include a power grid 905, solar power 906, wind power 907 are charging a plurality of battery modules 520 and 530. The system is discharging battery modules 510 and 540 through outputs to power electric vehicles 912 and 913, and the status of this operation is displayed on the status indicator 200. In some embodiments, this system is managed by external computing systems 901, 902 and 903.

FIG. 37-1 is an illustration of an example system where a plurality of input power sources connected to the input ports 150 include a power grid 905, a solar power source 906, and a wind power source 907, and the inputs are all charging a plurality of battery modules inside the multiple matrix energy flow control system. The system is discharging through output ports 160 which are connected to an electric vehicle 912, a home 915, and a personal electronic device such as a computer 914. In some embodiment, this system could be controlled by a wireless device 902.

FIG. 38 is an illustration of another example embodiment where the multiple matrix energy flow control system includes an upgradable battery module slot 5100.

Detailed Description of Example Embodiments

FIG. 1 is an illustration of an example system 100. The system 100 has an external housing 1000, a plurality of input ports 150, a plurality of output ports, and a status indicator display 200. Inside the system there is a main battery management printed circuit board assembly ("MBM PBCA") 700 (not shown in FIG. 1, see FIG. 10) and a plurality of battery modules 500. In the illustrated example, the external housing 1000 comprises a drawer-like opening section to provide access to the battery modules 500. In other embodiments, the housing 1000 may provide other ways to access the battery modules 500, such as for example a removable panel, a hinged door, or other mechanisms. Likewise, battery modules 500 may be held in slots, rack-mounted, or otherwise secured within the housing 1000.

FIG. 2 is an illustration of an embodiment with a plurality of input ports 150, which in another embodiment could leverage different types of connectors to facilitate use of the system with a variety of input power sources. In an embodiment, these input power sources could be multiple AC grids with different voltages or currents, a solar power DC port, or a wind power AC port, among others. FIG. 3 is an illustration of an embodiment where the other side of the external housing 1000 could have a plurality of output ports 160. The system is designed to support a broad array of external devices connected to the plurality of output ports, including industrial equipment and vehicles requiring high power levels to function and devices requiring lower power supplies such as handheld devices. To facilitate this support, in another embodiment, the output ports 160 could be fitted with different types of connectors.

The input ports 150 connect to the MBM PBCA 700, which communicates instructions to connect to one or more specified battery modules 500. In the example shown in FIG. 8, the battery module 500 itself has a slave battery management system ("SBMS") 505 and a plurality of battery cells 501 made of nickel-cadmium (NiCd), nickel-zinc (NiZn), nickel metal hydride (NiMH), lithium-ion (Li-ion), or other materials as developed over time.

The system 100 can be configured to contain any number of battery modules. FIG. 39 is an illustration of inside an embodiment of the system designed with available slots 5100 to be used for adding further battery modules to the system. This flexibility allows a user to ensure that the system can be tailored to meet its particular needs, which may change from time to time.

FIGS. 4-7 each show a status indicator 200 displaying the status of the system's inputs, outputs, and battery modules. When the system's input button 201 is active, the system will show the status of all input ports, including whether each port is connected or not connected to a power source and how much power is flowing through each input port. When the system's output button 202 is active, the system will show the status of all output ports, including whether each port is connected or not connected to a power source and how much power is flowing through each port. When the battery button 203 is active, the system will show the status of all battery modules, including whether those modules or charging, discharging, or lay dormant, and how much charge remains in each battery module.

Each of the system's input ports 150, output ports 160, battery modules 500, and the status indicator 200 are operatively connected to the MBM PBCA 700. As shown in FIG. 10, an example MBM PBCA 700 itself has an input connection 710 for connecting to the input ports 150, an output connection 720 for connecting to the output ports 160, a battery module connection 730 for connecting to the battery modules 500, and a status indicator connection 740 for connecting to the status indicator 200. The MBM PBCA 700 also has a main programming control chip ("MPCC") 701 which permits the user to programmatically specify control procedures for the system's inputs, outputs, and battery modules. FIG. 10-1 schematically illustrates control signal connections of the inputs 150, outputs 160, and battery modules 500 to the MBM PBCA 700. FIG. 14 schematically illustrates electrical power connections of the inputs 150, outputs 160, and battery modules 500 to the MBM PBCA 700.

FIGS. 15-23 schematically illustrate how the system can be configured to charge one or more battery modules 500 from one or more input ports 150 in a variety of situations. FIG. 15 is an illustration of a configuration with one input 151 electrically connected to one battery module 510. In this configuration, the input power will solely charge the connected battery module. As a result, the other battery modules 520, 530, and 540 will not be charged by that input. FIG. 16 is an illustration of a configuration with one Input 151 electrically connected to two battery modules 510 and 520. In this configuration, the one input charges the two battery modules simultaneously and equally. Consequently, with the same input power source, the system depicted in FIG. 16 would charge slower than the system depicted in FIG. 15. FIG. 17 is an illustration of a configuration with one input electrically connected to a plurality of battery modules, under which system each of the battery modules would be charged simultaneously and equally. In general, in such configurations, the charging rate of each battery module is inversely proportional to the number of battery modules connected to the single input power source.

FIG. 18 is an illustration of a configuration where two input power sources are electrically connected to a single battery module 510. Such a configuration enables the system to recharge the battery at twice the rate of the system depicted in FIG. 15. FIG. 19, FIG. 20, FIG. 21, FIG. 22, and FIG. 23 are illustrations of various options for electrically connecting a plurality of input ports 150 to a single battery module 500. By facilitating the charging of a single battery module from multiple power sources, the system provides a significant improvement over previous systems to meet the different demand of charging priority and increasing charging rates of a single battery module. An additional benefit of a system according to the present disclosure is that it increases the life time of the individual battery modules. While the lifetime of a conventional battery depends on the cycle time for each charge and discharge, the system disclosed in this invention extends that lifetime by implementing a prioritization method that detects whether a given battery is in need of being charged or needs to be discharged for a given output, reducing the number of times a given battery module is charged or discharged.

FIGS. 24-32 schematically illustrate how the system can be configured to discharge one or more battery modules 500 through one or more output ports 160 in a variety of situations. FIG. 24 is an illustration of a configuration where a single battery module 510 discharges through a single output port 161. In this configuration, the device connected to output port 161 will receive its energy solely from the single battery module 510. FIG. 25 is an illustration of a configuration in which one battery module 510 discharges through two output ports 161 and 162. The devices connected to output ports 161 and 162 would receive less output energy than the device connected to the output port 161 in the system depicted in FIG. 24. However, the system depicted in FIG. 25 can save the power of the other battery modules 520, 530 and 540 for future usage, thereby extending the lifetime of each of those battery modules 520, 530 and 540. FIG. 26 is an illustration of an embodiment in which a plurality of outputs are connected to a single one battery module. This configuration may result in reduced power output to each of the output ports; however, it will save the power in the other unconnected battery modules. If the user wishes to charge a device connected to output port 161 at an increased rate, then the user could configure additional battery modules 510 and 520 and connect them to the output port 161. An Embodiment of such a configuration resulting in increased discharging rates is illustrated in FIG. 27. FIG. 28, FIG. 29, FIG. 30, and FIG. 32 are illustrations of embodiments where a plurality of output ports 160 are connected to a plurality of battery modules 500.

FIG. 33 is an illustration of how an example system with the inputs 150, outputs 160, and battery modules 500 connected via the MBM PBCA 700, and configured such that the inputs include only two active connections 151 and 153. In an example embodiment, one connection 151 could be to AC grid, and the other connection 153 could be to a solar power source. These two inputs 151 and 153 will charge the battery modules 510 and 520. Another battery module 530 is being discharged through output ports 162 and 163. This charging configuration can be controlled by the MBM PBCA 700. Subject to the charging condition of the battery modules, the system could also charge the other battery modules 530 or 540. Alternatively, the two inputs could only charge one particular battery module 510. FIG. 15-FIG. 23 are illustrations of this type of connection in various embodiments of systems. Further, the MBM PBCA permits the user to prioritize one battery module over the others such that if one battery module required an immediate charge, then two or more inputs could be directed to charge that battery module. In another foreseeable situation, if a battery module is fully charged and is connected to outputs 162 and 163 for discharge, then that battery module will not need to be charged. In such a circumstance, inputs 151 and 153 could be configured to charge the other battery modules 510 and 510 before charging the module not in need of a charge, thereby extending that battery module's lifetime by not unnecessarily charging it. This battery-saving technique is enhanced by programming the MBM PBCA 700 to detect the cycle time of each battery module, allowing it to extend the overall life time of that particular battery module.

When one battery module 530 is being discharged through output ports 162 and 163, that discharge can be managed by the MBM PBCA 700 by programming that assembly to draw from a particular quantity of battery cells, depending on the needs of the device into which the system is discharging. Where the device connected to output port 162 requires an urgent charge, the MBM PBCA 700 could be configured to prioritize discharging the battery module 530 to output port 162 first and then to output port 163 afterwards. Alternatively, if the device connected to output port 162 requires an urgent discharge, the MBM PCBA 700 could be configured to direct additional battery modules to discharge through output 162 to increase the rate of discharge through that port, thereby charging the connected device faster than it would if powered by only a single battery module.

The status information of the input ports 150, output ports 160, and battery modules 500 could be stored on the MBM PBCA 700, and that information could be exported and transferred to an application on an external computing device such as a personal computer 903, smart phone 902, or mobile personal computer 901. FIG. 34 is an illustration of this connection to an external computing device, and FIG. 35 is an illustration of the type of data displayed on the screen 800. In an embodiment, this screen will primarily display the operational status of the inputs, outputs and battery modules. This management system can be modified by users, and a user can specify different connection options between each of the inputs, outputs and battery modules.

FIG. 36 is a schematic illustration of an example switching matrix created by a web of connections between inputs 151, 152, outputs 161, 162, and battery modules 510, 520, 530, 540, all of which is controlled by the MBM PBCA. Although the example of FIG. 36 shows two inputs and outputs, and four battery modules, it is to be understood that the switching matrix could be expanded to accommodate any number of inputs, outputs and battery modules. The benefits of this flexible management system include prioritizing charging and discharging of particular battery modules, and adjusting the discharge rate to given devices connected to output ports to charge other devices faster than conventional charging systems. FIG. 36-1 shows another example switching matrix, wherein each battery module can be selectively connected to one or more of the other battery modules, allowing the MBM PBCA to charge one or more battery modules using energy stored in one or more other battery modules.

FIG. 37 is an illustration of an embodiment with different input options 905, 906, and 907 with different priorities set for charging the battery modules 510, 520, 530, and 540 and different settings for the output ports connected to an electric vehicle 912 and 913. In this embodiment, assorted information from the inputs, outputs, and battery modules is displayed on the status indicator 200, and could also be displayed on external computing devices 901, 902, and 903. FIG. 37-1 is an illustration of an embodiment involving different output options 912, 915, and 914. The MBM PBCA can be programmed to prioritize the charging of any of these devices, such as a personal computer 912, as needed or desired.

FIG. 38 shows another embodiment wherein a plurality of individual multiple matrix energy flow control systems 1001, 1002, 1003, and 1004 are managed by a central management system 850. The individual priority systems for the inputs, outputs, and battery modules 801, 802, 803, and 804 could be collectively managed by the central management system 850. Leveraging the central management system 850 would enable the system to display detailed statuses of the input ports, output ports, and battery modules within each multiple matrix energy flow control system.

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing implementation of the various example embodiments described herein.

The description provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

The embodiments of the devices, systems and methods described herein may be implemented in a combination of both hardware and software. These embodiments may be implemented on programmable computers, each computer including at least one processor, a data storage system (including volatile memory or non-volatile memory or other data storage elements or a combination thereof), and at least one communication interface. For example, the programmable computers may be a server, network appliance, set-top box, embedded device, computer expansion module, personal computer, laptop, personal data assistant, cloud computing system or mobile device. A cloud computing system is operable to deliver computing service through shared resources, software and data over a network. Program code is applied to input data to perform the functions described herein and to generate output information. The output information is applied to one or more output devices to generate a discernible effect. In some embodiments, the communication interface may be a network communication interface. In embodiments in which elements are combined, the communication interface may be a software communication interface, such as those for inter-process communication. In still other embodiments, there may be a combination of communication interfaces.

Program code is applied to input data to perform the functions described herein and to generate output information. The output information is applied to one or more output devices. In some embodiments, the communication interface may be a network communication interface. In embodiments in which elements may be combined, the communication interface may be a software communication interface, such as those for inter-process communication. In still other embodiments, there may be a combination of communication interfaces implemented as hardware, software, and combination thereof.

Each program may be implemented in a high level procedural or object oriented programming or scripting language, or both, to communicate with a computer system. However, alternatively the programs may be implemented in assembly or machine language, if desired. In any case, the language may be a compiled or interpreted language. Each such computer program may be stored on a storage media or a device (e.g. ROM or magnetic diskette), readable by a general or special purpose programmable computer, for configuring and operating the computer when the storage media or device is read by the computer to perform the procedures described herein. Embodiments of the system may also be considered to be implemented as a non-transitory computer-readable storage medium, configured with a computer program, where the storage medium so configured causes a computer to operate in a specific and predefined manner to perform the functions described herein.

Furthermore, the system, processes and methods of the described embodiments are capable of being distributed in a computer program product including a physical non-transitory computer readable medium that bears computer usable instructions for one or more processors. The medium may be provided in various forms, including one or more diskettes, compact disks, tapes, chips, magnetic and electronic storage media, and the like. The computer useable instructions may also be in various forms, including compiled and non-compiled code.

Embodiments described herein may relate to various types of computing applications, such as image processing and generation applications, computing resource related applications, speech recognition applications, video processing applications, semiconductor fabrication, and so on. By way of illustrative example embodiments may be described herein in relation to image-related applications.

Throughout the foregoing discussion, numerous references will be made regarding servers, services, interfaces, portals, platforms, or other systems formed from computing devices. It should be appreciated that the use of such terms is deemed to represent one or more computing devices having at least one processor configured to execute software instructions stored on a computer readable tangible, non-transitory medium. For example, a server can include one or more computers operating as a web server, database server, or other type of computer server in a manner to fulfill described roles, responsibilities, or functions.

The technical solution of embodiments may be in the form of a software product. The software product may be stored in a non-volatile or non-transitory storage medium, which can be a compact disk read-only memory (CD-ROM), a USB flash disk, or a removable hard disk. The software product includes a number of instructions that enable a computer device (personal computer, server, or network device) to execute the methods provided by the embodiments.

The embodiments described herein are implemented by physical computer hardware, including computing devices, servers, receivers, transmitters, processors, memory, displays, and networks. The embodiments described herein provide useful physical machines and particularly configured computer hardware arrangements.

Although the embodiments have been described in detail, it should be understood that various changes, substitutions and alterations can be made herein. Moreover, the scope of the present application is not intended to be limited to the particular embodiments of the process, machine, manufacture, composition of matter, means, methods and steps described in the specification. As can be understood, the examples described above and illustrated are intended to be exemplary only.

The present disclosure may be embodied in other specific forms without departing from its spirit or essential characteristics. The described embodiments are to be considered in all respects only as illustrative and not restrictive.

As will be apparent to those skilled in the art in light of the foregoing disclosure, many alterations and modifications are possible to the methods and systems described herein. While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as may reasonably be inferred by one skilled in the art. The scope of the claims should not be limited by the embodiments set forth in the examples, but should be given the broadest interpretation consistent with the foregoing disclosure.

The present disclosure may be embodied in other specific forms without departing from its spirit or essential characteristics. The described embodiments are to be considered in all respects only as illustrative and not restrictive.

The invention claimed is:

1. An energy storage system comprising:
a plurality of input ports connectable to receive electrical power from a plurality of energy sources;
the plurality of output ports connectable to deliver electrical power to one or more loads;
a plurality of battery modules for charging through the plurality of input ports and discharging through the plurality of output ports;
a switching matrix configured to selectively connect each battery module to any number of the plurality of input ports or any number of the plurality of output ports, each input port to any number of battery modules, and each output port to any number of battery modules; and
a main battery management controller operably coupled to the switching matrix for controlling connections between the input ports, the output ports and the battery modules, wherein the main battery management controller is programmable to control different connections between the input ports, the output ports and the battery modules, wherein the main battery management controller has a plurality of connectors to relay information to the input ports, output ports, and battery modules.

2. The system of claim 1 wherein the switching matrix is configured to selectively connect each of the plurality of battery modules to any number of other ones of the plurality of battery modules.

3. The system of claim 1 wherein the main battery management controller is configured to detect input power characteristics of an active input port, determine one or more selected charging battery modules of the plurality of battery modules based on the input power characteristics, and connect the active input port to the one or more selected charging battery modules.

4. The system of claim 1 wherein the main battery management controller is configured to detect load requirements of an active output port, determine one or more selected discharging battery modules of the plurality of battery modules based on the load requirements, and connect the active output port to the one or more selected discharging battery modules.

5. The system of claim 1 comprising a housing containing the input ports, output ports, battery modules, switching matrix, and main battery management controller.

6. The system of claim 5 wherein the housing comprises one or more upgradeable battery module slots for receiving additional battery modules.

7. The system of claim 1 wherein the battery modules comprise a plurality of different battery types having different characteristics.

8. The system of claim 1 wherein the switching matrix and the main battery management controller are provided on a main battery management printed circuit board assembly.

9. The system of claim 1 comprising a status indicator for displaying status information about the battery modules, and wherein the main battery management controller detects the status of each battery module.

10. The system of claim 1 wherein the plurality of input ports comprise a plurality of input sockets, wherein each of the plurality of input sockets are different to support an array of different energy sources.

11. The system of claim 1 wherein the plurality of output ports comprise a plurality of output sockets, wherein each of the plurality of input sockets are different to support an array of different loads.

12. The system of claim 1 wherein the plurality of input ports comprise a plurality of types of input ports.

13. The system of claim 1 wherein the plurality of output ports comprise a plurality of types of output ports.

14. The system of claim 8 wherein the plurality of input ports comprise a plurality of types of input ports, wherein the plurality of output ports comprise a plurality of types of output ports, wherein the main battery management printed circuit board assembly manages each battery module independently using the plurality of types of input ports and the plurality of types of output ports, wherein the main battery management printed circuit board assembly links an input port to a corresponding output port without physical modification of the input port and the corresponding output port.

15. The system of claim 8 wherein the main battery management printed circuit board assembly is configured for different connection options between each of the input ports, output ports and battery modules based on different types of input ports and different types of output ports.

16. The system of claim 1 wherein the switching matrix comprises a web of connections between the plurality of battery modules and the plurality of input ports, and between the plurality of battery modules and the plurality of output ports, and wherein the main battery management controller operably controls the connections of the switching matrix.

17. The system of claim 1 wherein the plurality of input ports comprise a plurality of different types of input connectors for use with different types of energy sources of the plurality of energy sources, and wherein the plurality of output ports comprise a plurality of types of output connectors for use with different external devices, wherein the input ports and output ports connect to multiple types of battery modules with different charge and discharge requirements.

18. The system of claim 1, wherein the plurality of input ports comprise a plurality of types of input ports, wherein the plurality of output ports comprise a plurality of types of output ports, and wherein the switching matrix comprises a web of connections between the plurality of types of input ports and the plurality of battery modules, and between the plurality of battery modules and the plurality of types of output ports, and wherein the main battery management controller operably controls the connections of the switching matrix using instructions such that any of the plurality of types of input ports connect to any one or all of the plurality of battery modules, and one or more of the plurality of battery modules connect to any of the plurality of types of output ports.

19. The system of claim 1, wherein the switching matrix prioritizes charging and discharging of particular battery modules and adjusts a charge rate or a discharge rate.

20. The system of claim 1, the main battery management controller controls and monitors power levels of charging through the plurality of input ports and discharging through the plurality of output ports.

* * * * *